(12) United States Patent
Kim et al.

(10) Patent No.: US 12,418,996 B2
(45) Date of Patent: Sep. 16, 2025

(54) DISPLAY DEVICE AND METHOD OF DRIVING DISPLAY DEVICE

(71) Applicant: Samsung Display Co., LTD., Yongin-si (KR)

(72) Inventors: Won Tae Kim, Yongin-si (KR); Soo Hyun Moon, Yongin-si (KR); Jun Seok Min, Yongin-si (KR); Woo Guen Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 17/988,659

(22) Filed: Nov. 16, 2022

(65) Prior Publication Data

US 2023/0225064 A1    Jul. 13, 2023

(30) Foreign Application Priority Data

Jan. 10, 2022    (KR) .......................... 10-2022-0003606

(51) Int. Cl.
*H05K 5/02*    (2006.01)
*H01L 25/16*    (2023.01)

(52) U.S. Cl.
CPC .......... *H05K 5/0217* (2013.01); *H01L 25/167* (2013.01)

(58) Field of Classification Search
CPC ........................... H05K 5/0017; H05K 5/0217
USPC .......................................................... 361/807
See application file for complete search history.

(56) References Cited

U.S. PATENT DOCUMENTS

2018/0376603 A1\*  12/2018  Lee ................... H05K 5/0217
2021/0183275 A1\*  6/2021   Han ....................... G09F 9/301
2022/0210958 A1\*  6/2022   Yoon .................. H05K 9/0054

\* cited by examiner

*Primary Examiner* — Hung S. Bui
(74) *Attorney, Agent, or Firm* — Womble Bond Dickinson (US) LLP

(57) ABSTRACT

A display device includes: a display panel including pixels; a housing accommodating the display panel, the housing having a slot at one side surface thereof; a rotating member inside the housing, the rotating member configured for rolling and unrolling the display panel; and a holding member holding the rotating member. The holding member being configured to vary a position of the rotating member inside the housing.

24 Claims, 21 Drawing Sheets

310: 311, 312, 313
320: 321, 322, 323
FM: 310, 320

DISPLAY DEVICE AND METHOD OF DRIVING DISPLAY DEVICE

CROSS-REFERENCE TO RELATED APPLICATION

The application claims priority to and the benefit of Korean patent application No. 10-2022-0003606, filed on Jan. 10, 2022, in the Korean Intellectual Property Office, the entire disclosure of which is incorporated herein by reference.

BACKGROUND

1. Field

Aspects of embodiments of the present disclosure relate to a display device and a method of driving a display device.

2. Description of the Related Art

Recently, as interest in information displays increases, research and development of display devices has been continuously conducted.

SUMMARY

Embodiments of the present disclosure provide a display device and a method of driving the same having a reduced non-driving area.

According to an embodiment of the present disclosure, a display device includes: a display panel including pixels; a housing accommodating the display panel therein, the housing having a slot at one side surface thereof; a rotating member inside the housing, the rotating member configured for rolling and unrolling the display panel; and a holding member holding the rotating member. The holding member configured to vary a position of the rotating member inside the housing.

The holding member may be configured to move the rotating member away from the slot when the display panel is rolled and to move the rotating member toward the slot when the display panel is unrolled.

The holding member may be configured to move the rotating member in a first direction in which the display panel is unrolled.

The holding member may include: a first fixing part coupled to the housing; and a first moving part movably coupled to the first fixing part. The first moving part may hold the rotating member.

The first moving part may include a first rack extending in the first direction. The first fixing part may include a first pinion gear engaged with the first rack.

The holding member may further include a first driving part configured to rotate the first pinion gear.

The first moving part may include: a first belt having an end coupled to the first fixing part; and a wheel coupled to another end of the first belt. The wheel may be configured for rolling and unrolling the first belt.

The holding member may be configured to move the rotating member in each of the first direction and a second direction perpendicular to the first direction.

The holding member may be configured to move the rotating member in a second direction perpendicular to a first direction in which the display panel is unrolled.

The holding member may include: a second fixing part fixed to the housing; and a second moving part movably coupled to the second fixing part. The second moving part may support the rotating member.

The second moving part may include a second rack extending in the second direction. The second fixing part may include a second pinion gear engaged with the second rack.

The holding member may further include a second driving part configured to rotate the second pinion gear.

The second fixing part may include: a first gear; a second gear spaced apart from the first gear; and a second belt coupled to the first and second gears. The second moving part may be coupled to a portion of the second belt.

The holding member may be configured to move the rotating member in a third direction toward the slot from a rotating shaft of the rotating member.

The holding member may include: a fixing part fixed to the housing; and a moving part movably coupled to the fixing part. The moving part may hold the rotating member.

The moving part may include a rack extending in the third direction. The fixing part may include a pinion gear engaged with the rack.

The holding member may further include a driving part configured to rotate the pinion gear.

The holding member may be configured to move the rotating member toward the slot after the display panel is completely unrolled.

The rotating member may be configured to roll the display panel, after the holding member moves the rotating member away from the slot, when the display panel is unrolled.

The holding member may be configured to vary the position of the rotating member while the rotating member rolls and unrolls the display panel.

According to another embodiment of the present disclosure, a method of driving a display device is provided. The display device includes a rotating member configured for rolling and unrolling a display panel inside a housing having a slot at one side surface thereof and a holding member holding the rotating member. The method includes: unrolling the display panel via the rotating member; moving the rotating member toward the slot via the holding member; rolling the display panel via the rotating member; and moving the rotating member away from the slot via the holding member.

The moving of the rotating member toward the slot may include moving the rotating member toward the slot after the display panel is completely unrolled.

During the rolling of the display panel, the display panel may be rolled after the rotating member is moved away from the slot when the display panel is unrolled.

During each of the moving of the rotating member toward the slot and the moving of the rotating member away from the slot, a position of the rotating member may be varied while the rotating member rolls and unrolls the display panel.

BRIEF DESCRIPTION OF THE DRAWINGS

Example embodiments will now be described more fully hereinafter with reference to the accompanying drawings; however, the present disclosure may be embodied in different forms and should not be construed as limited to the embodiments described herein. Rather, these embodiments are provided so that this disclosure will be thorough and complete and will fully convey the scope of the present disclosure to those skilled in the art.

In the drawing figures, dimensions may be exaggerated for clarity of illustration.

DETAILED DESCRIPTION

Figure 1:
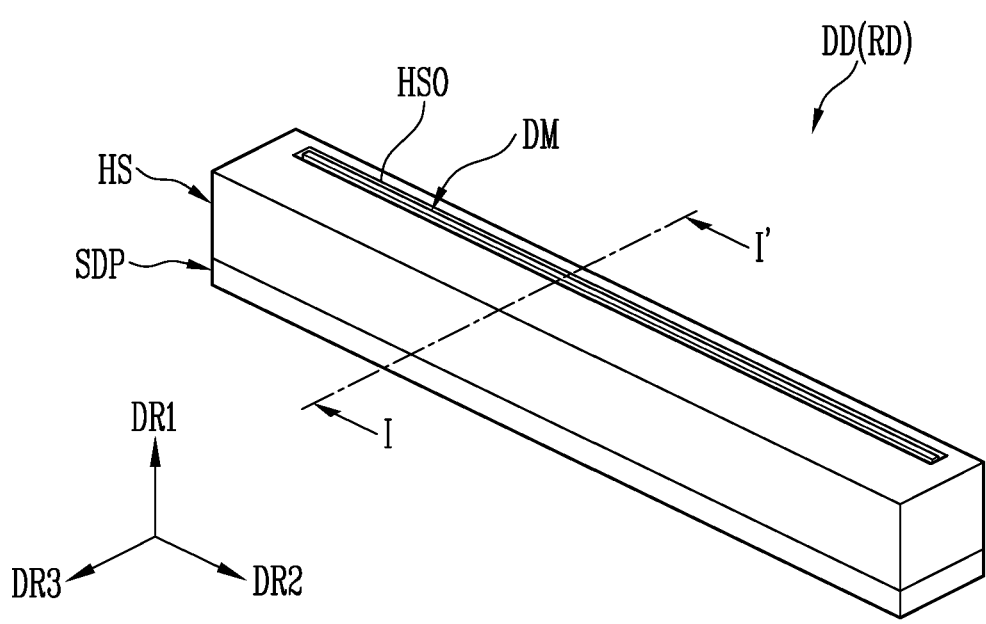
FIG. 1 is a perspective view schematically illustrating a display device according to an embodiment of the present disclosure.

The present disclosure is described herein by using examples, but the present disclosure encompasses various changes and different shapes. Thus, the examples are not limited to certain shapes but apply to all the change and equivalent material and replacement. The drawings included are illustrated a fashion where the figures are expanded for the better understanding. Like numbers refer to like elements throughout. In the drawings, the thickness of certain lines, layers, components, elements or features may be exaggerated for clarity.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. An expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (e.g., a first element) is "(operatively or communicatively) coupled with/to" or "connected to" another element (e.g., a second element), the element may be directly coupled with/to another element or there may be an intervening element (e.g., a third element) between the element and another element. Also, in this specification, the term "connection" or "coupling" may inclusively indicate connection or physical and/or electrical coupling.

Hereinafter, embodiments of the present disclosure and descriptions for those skilled in the art to easily understand the content of the present disclosure will be described, in detail, with reference to the accompanying drawings. In the following description, singular forms in the present disclosure are intended to include the plural forms as well, unless the context clearly indicates otherwise.

Figure 2:
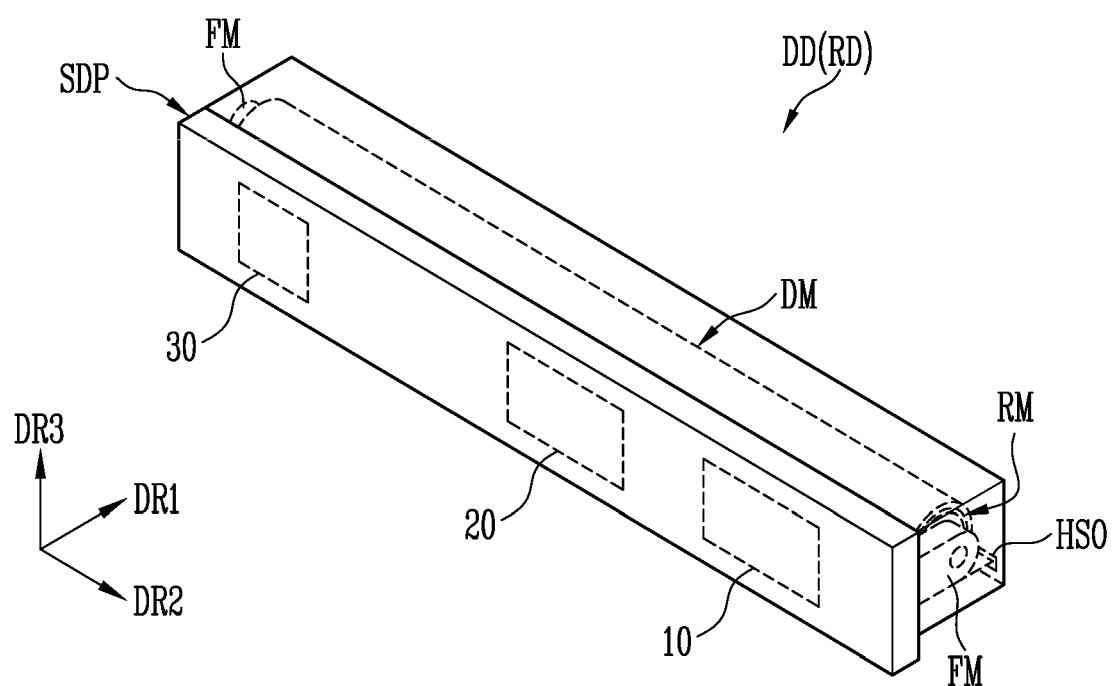
FIG. 2 is a side perspective view schematically illustrating the display device shown in FIG. 1.
Figure 3:
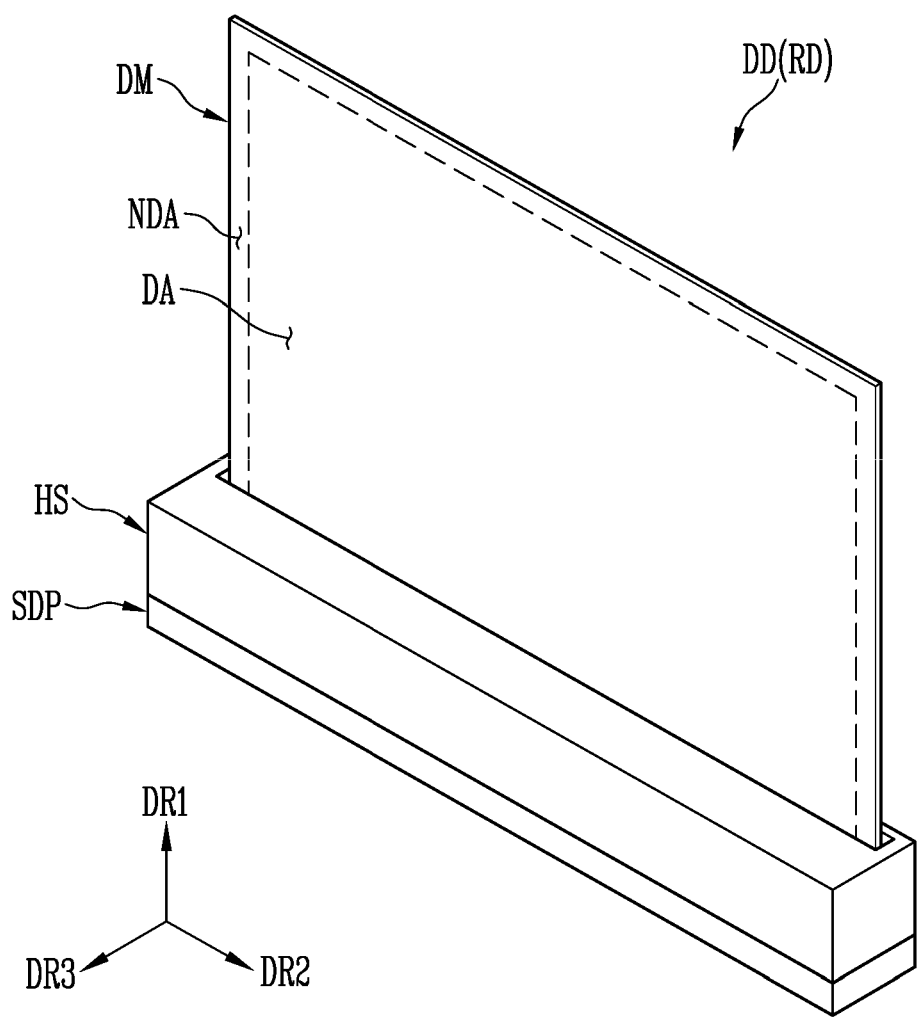
FIG. 3 is a perspective view illustrating the display device shown in FIG. 1 in a display mode.

FIG. 1 is a perspective view schematically illustrating a display device according to an embodiment of the present disclosure. FIG. 2 is a side perspective view schematically illustrating the display device shown in FIG. 1. FIG. 3 is a perspective view illustrating the display device shown in FIG. 1 in a display mode in which it is unrolled.

Referring to FIGS. 1 to 3, the display device DD according to the embodiment of the present disclosure may be a rollable display device RD.

The display device DD may include a housing HS and a mounting part (e.g., a mounting plate) SDP. A display module (e.g., a display panel) DM rolled with a curvature (e.g., a predetermined curvature) may be located (or arranged) inside the housing HS. The display module DM may be a rollable display module.

The housing HS is accommodates the rolled display module DM therein, and a slot (e.g., a housing opening) HSO through which the display module DM can pass may be provided at one side surface of the housing HS. A rotating member (e.g., a roller) RM may be rotatably installed inside the housing HS. The slot HSO in the housing HS may be a path for rolling and unrolling (or unwinding) the display module DM. As an example, the display module DM may be rolled inside the housing HS through the slot HSO in the housing HS and/or may be unrolled to the outside of the housing HS (e.g., in a first direction DR1).

A shape of the slot HSO in the housing HS may correspond to a sectional shape of the display module DM, but the present disclosure is not limited thereto.

The rotating member RM may be accommodated in the housing HS to roll and/or unroll the display module DM. The rotating member RM may be fixed in the housing HS by a holding member FM. The rotating member RM may have a cylindrical shape extending in the second direction DR2. The display module DM may be rolled on an outer circumferential surface of the rotating member RM.

The holding member FM may fix the rotating member RM. For example, the holding member FM may be disposed at both end portions (e.g., both ends) of the rotating member RM, and a rotating shaft of the rotating member RM may be rotatably coupled to the holding member FM. Also, the holding member FM may rotate the rotating member RM. In an embodiment, the holding member FM may include a motor disposed at at least one side of the rotating member RM to rotate the rotating shaft of the rotating member RM. The motor may include, for example, a stepping motor, a thermo motor, and the like.

The mounting part SDP may be provided at one side of the housing HS. The mounting part SDP may be provided with a controller 30 for outputting an image to the display module DM, a power supply 20, a speaker for outputting a sound, an input/output terminal configured to input and/or output various signals, and a wireless transceiver configured to transmit and/or receive a signal (e.g., a wireless signal). The controller 30 may include various control printed circuit boards, the power supply 20 may include various power supply printed circuit boards, and the control printed circuit boards and the power supply printed circuit boards may be installed inside the mounting part SDP, but the present disclosure is not limited thereto. In some embodiments, the mounting part SDP may be provided with a motor controller 10 for controlling the motor.

The display module DM may display (e.g., may be configured to display) an image. For example, the display module DM may display the image in a third direction DR3, but the present disclosure is not limited thereto. For example, the display module DM may display the image in the opposite direction of the third direction DR3 or both the third direction DR3 and the opposite direction of the third direction.

The display module DM may be flexible. In an example, the display module DM may have a rolling characteristic (e.g., the display module DM may be rollable). Accordingly, when the display device DD is in a closed mode (e.g., a closed or retracted state), the display module DM may be rolled and accommodated inside the housing HS. When the display device DD is in an open mode (e.g., an open or extended state), the display module DM may be extracted (or unwound or extended) in the opposite direction of the rolling direction to be unrolled in one direction from the housing HS.

The display module DM may be changed from a state in which the display module DM is completely rolled to a state in which the display module DM is completely (or substantially completely) unrolled, or may be changed from the state in which the display module DM is completely (or substantially completely) unrolled to the state in which the display module DM is completely rolled. The state in which the display module DM is completely rolled may be a state in which the display module DM is accommodated inside the housing HS such that the display device DD does not display any image. In some embodiments, the display module DM may be changed from the state in which the display module DM is completely rolled to a state in which only a portion of the display module DM is unrolled. The state in which only a portion of the display module DM is unrolled may be a state in which a portion (e.g., only a portion) of the display module MD is disposed at the outside of the housing HS.

The display module DM may have various shapes. In an example, the display module DM may have a rectangular plate shape having two pairs of sides parallel to each other, but the present disclosure is not limited thereto. When the display module DM has the rectangular plate shape, any one pair from among the two pairs of sides may be longer that the other pair of sides. Although an embodiment in which the display module DM has an angled corner portion (e.g., a right angle corner portion) and straight edges is illustrated in the drawings, the present disclosure is not limited thereto.

The display module DM may have a display area DA in which an image is displayed and a non-display area NDA provided at at least one side of the display area DA. The non-display area NDA is an area in which the image is not displayed.

In some embodiments, the display module DM may have a sensing area and a non-sensing area. For example, the display module DM may not only display an image at (or through) the sensing area but may also sense a touch input made on a display surface (or input surface) or sense light incident from the front. The non-sensing area may surround (e.g., may extend around a periphery of) the sensing area. However, this is merely illustrative, and the present disclosure is not limited thereto. In some embodiments, a partial area of the display area DA may correspond to the sensing area.

Figure 4:
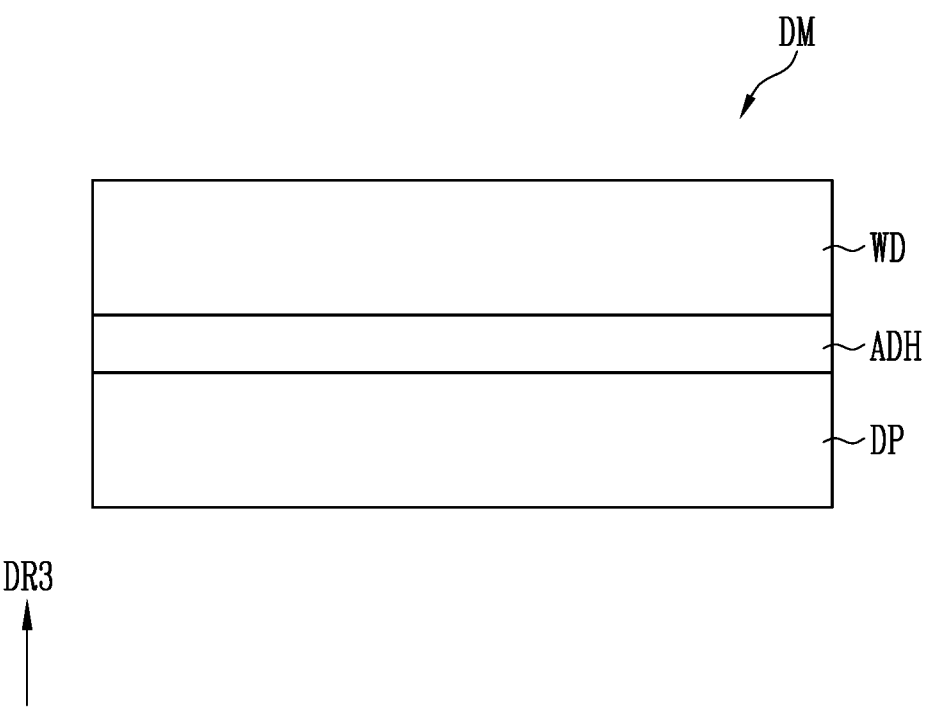
FIG. 4 is a schematic sectional view of the display module included in the display device shown in FIG. 3.
Figure 5:
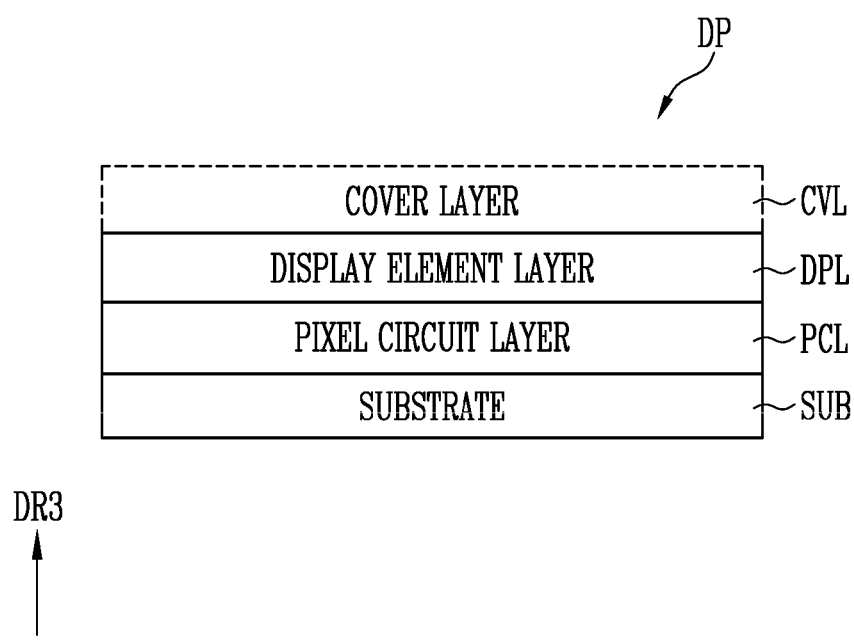
FIG. 5 is a schematic sectional view of a display panel included in the display module shown in FIG. 4.

FIG. 4 is a schematic sectional view of the display module included in the display device shown in FIG. 3. FIG. 5 is a schematic sectional view of a display panel included in the display module shown in FIG. 4.

Referring to FIGS. 1 to 5, the display module DM may include a display panel DP, a window WD, and an adhesive layer ADH.

The display panel DP may display an image. A self-luminescent display panel, such as an organic light emitting diode (OLED) display panel using an organic light emitting diode as a light emitting element, a micro-LED or nano-LED display panel using a micro-LED or nano-LED as a light emitting element, or a quantum dot organic light emitting diode (QD OLED) display panel using a quantum dot and an organic light emitting diode, may be used as the display panel DP. In addition, a non-self-luminescent display panel, such as a liquid crystal display panel (LCD panel), an electro-phoretic display panel (EPD panel), or an electro-wetting display panel (EWD panel), may be used as the display panel DP. When a non-self-luminescent display panel is used as the display panel DP, the display device DD may include a backlight unit for supplying light to the display panel DP.

The display panel DP may include a substrate SUB and a pixel circuit layer PCL, a display element layer DPL, and a cover layer CVL, which are sequentially located on the substrate SUB.

The substrate SUB may be configured as one area (e.g., may be a single, continuous substrate) having a rectangular shape. However, the number of areas provided in the substrate SUB may be different from the above-described example, and the substrate SUB may have different shapes according to areas provided to the substrate SUB.

The substrate SUB may be made of an insulative material, such as glass or resin. Also, the substrate SUB may be made of a flexible material to be bendable or foldable and may have a single- or multi-layered structure. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the substrate SUB is not limited to the above-described materials and/or embodiments.

The pixel circuit layer PCL may be provided on the substrate SUB and includes a plurality of transistors and signal lines connected to the plurality of transistors. For example, each transistor may include a semiconductor layer, a gate electrode, a first terminal, and a second terminal that are sequentially stacked with insulating layers interposed therebetween. The semiconductor layer may include amorphous silicon, poly-silicon, low temperature poly-silicon, an organic semiconductor, and an oxide semiconductor. The gate electrode, the first terminal, and the second terminal may include one of aluminum, copper, titanium, and molybdenum, but the present disclosure is not limited thereto. Also, the pixel circuit layer PCL may include at least one insulating layer.

The display element layer DPL may be disposed on the pixel circuit layer PCL. The display element layer DPL may include a light emitting element for emitting light. The light emitting element may be, for example, an organic light emitting diode, but the present disclosure is not limited thereto. In some embodiments, the light emitting element may be an inorganic light emitting element including an inorganic light emitting material or a light emitting element for emitting light by changing the wavelength of light emitted by using a quantum dot.

The cover layer (e.g., encapsulation layer) CVL may be selectively disposed on the display element layer DPL. The cover layer CVL may be an encapsulation substrate or an encapsulation layer having a multi-layer structure. When the cover layer CVL is the encapsulation layer, the cover layer CVL may include an inorganic layer and/or an organic layer. For example, the cover layer CVL may include an inorganic layer, an organic layer, and an inorganic layer that are sequentially stacked. The cover layer CVL may prevent external air and external moisture from infiltrating into the display element layer DPL and the pixel circuit layer PCL.

In some embodiments, the cover layer CVL may be made of thermosetting resin and/or photocurable resin. Therefore, after the cover layer CVL is coated on the substrate SUB in a liquid form, the cover layer CVL may be cured through a curing process using heat and/or light. Thus, the cover layer CVL may more stably fix the light emitting element while protecting the light emitting element.

The window WD for protecting an exposed surface of the display panel DP may be provided on the display panel DP. The window WD may protect the display panel DP from external impacts and may provide an input surface and/or a display surface to a user. The window WD may be coupled to the display panel DP by using the adhesive layer ADH. The adhesive layer ADH may include an optically clear adhesive material.

The window WD may have a multi-layer structure selected from a glass substrate, a plastic film, and a plastic substrate. The multi-layer structure may be formed through a continuous process or an adhesion process using an adhesive layer. The whole or a portion of the window WD may be flexible.

A touch sensor may be disposed between the display panel DP and the window WD. The touch sensor may be directly disposed on a surface on which an image is emitted from the display panel DP to receive a touch input of a user.

Figure 6:
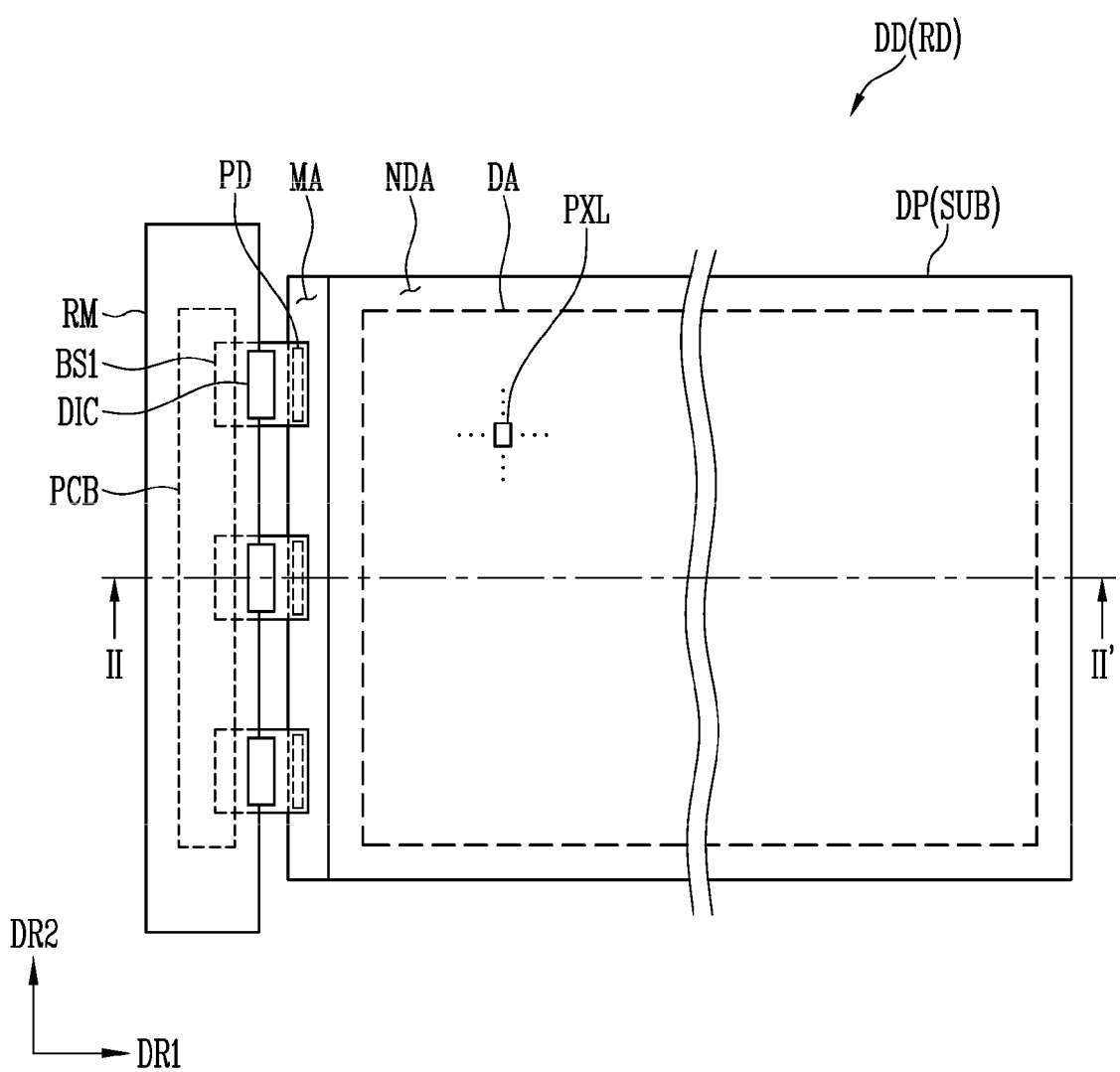
FIG. 6 is a plan view schematically illustrating a portion of the display device shown in FIG. 1.
Figure 7:
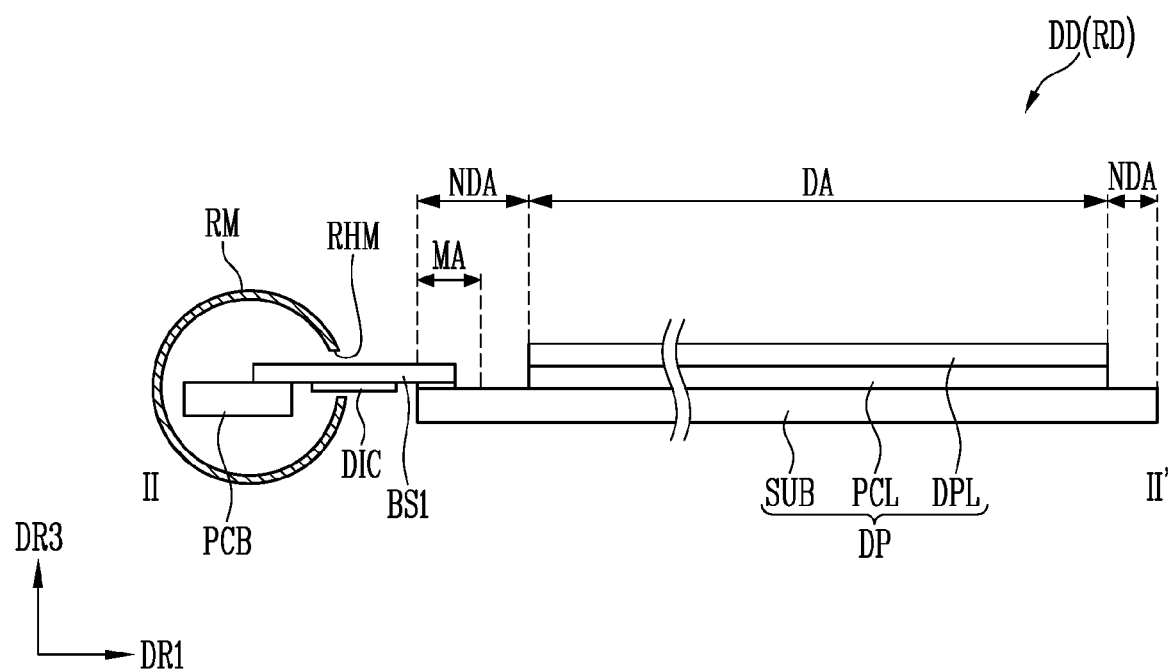
FIG. 7 is a schematic sectional view taken along the line II-II' in FIG. 6.
Figure 8:
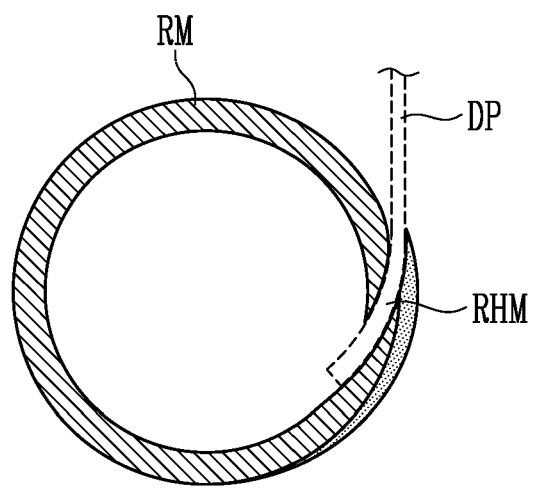
FIG. 8 is a sectional view illustrating an embodiment of a rotating member included in the display device shown in FIG. 7.

FIG. 6 is a plan view schematically illustrating a portion of the display device shown in FIG. 1. FIG. 7 is a schematic sectional view taken along the line II-II' in FIG. 6. FIG. 8 is a sectional view illustrating an embodiment of a rotating member included in the display device shown in FIG. 7.

Referring to FIGS. 1 to 8, the display device DD may include the display panel DP, a driving integrated circuit DIC, a circuit board PCB, and the rotating member RM.

The display panel DP may include the substrate SUB, the pixel circuit layer PCL, and the display element layer (e.g., the display layer) DPL. In some embodiments, the display panel DP may include the cover layer CVL (see, e.g., FIG. 5) on the display element layer DPL.

The display panel DP may have the display area DA and the non-display area NDA. The display area DA may be an area in which pixels PXL are provided to display an image. The non-display area NDA is an area in which the pixels PXL are not provided and may be an area in which the image is not displayed.

The non-display area NDA may be provided at at least one side of the display area DA. The non-display area NDA may surround the circumference (e.g., the edge or periphery) of the display area DA. A line part connected to the pixels PXL and the driving integrated circuit DIC, which is connected to the line part and drives the pixels PXL, may be provided in the non-display area NDA. The non-display area NDA may have a mounting area MA in which the circuit board PCB is coupled to the display panel DP. As an example, the mounting area MA may be one area of the non-display area NDA. A pad part PD including a plurality of pads may be located in the mounting area MA. The pad part PD may be physically and/or electrically to the circuit board PCB through a conductive adhesive member. Also, the pad part PD may be electrically connected to the driving integrated circuit DIC through the circuit board PCB. The conductive adhesive member may include an anisotropic conductive film.

The line part may electrically connect the driving integrated circuit DIC and the pixels PXL to each other. The line part may include signal lines, which provide a signal to each pixel PXL and are connected to each pixel PXL (e.g., fan-out lines connected to a scan line, a data line, and the like).

The pixels PXL may be provided in the display area DA of the display panel DP (or the substrate SUB). As an example, the pixels PXL may be provided on one surface of the substrate SUB located in the display area DA. For convenience of description, only one pixel PXL is illustrated in FIG. 6, but a plurality of pixels PXL may be substantially provided on the one surface of the substrate SUB. Each of the pixels PXL may be a minimum unit for displaying an image. Each of the pixels PXL may include a light emitting element emitting white light and/or colored light. Each of the pixels PXL may emit light of any one color from among red, green, and blue. However, the present disclosure is not limited thereto, and each of the pixels PXL may emit light of a color including cyan, magenta, yellow, and the like.

The pixels PXL may be arranged in a matrix form in rows extending in the first direction DR1 and columns extending in the second direction DR2. However, the arrangement form of the pixels PXL is not particularly limited, and the pixels PXL may be arranged in various suitable forms. Although an embodiment in which the pixels PXL have a rectangular shape is illustrate in the drawings, the present disclosure is not limited thereto. The pixels PXL may be modified to have various suitable shapes. In addition, when the pixel PXL is provided in plurality, the plurality of pixels PXL may be provided to have different areas (or sizes). For example, in an embodiment in which the pixels PXL emit lights of different colors, the pixels PXL with respect may have different areas (or sizes) or different shapes corresponding to the different colors.

The driving integrated circuit DIC may be mounted on one surface of a first base layer (e.g., first base substrate) BS1 to be electrically connected to the circuit board PCB and the pad part PD. The driving integrated circuit DIC may receive signals output from the circuit board PCB and may output signals (e.g., predetermined signals), a driving voltage, and the like, which are to be provided to the pixels PXL, based on the received signals. The signals and the driving voltage, which are described above, may be transferred to the pixels PXL through the pad part PD.

The circuit board PCB may supply image data, a control signal, a power voltage, and the like to the display panel DP. The printed circuit board PCB may be a flexible wiring board or a rigid wiring board.

When the display panel DP is rolled on the rotating member RM, the printed circuit board PCB may be located inside the rotating member RM. An internal space in which the circuit board PCB and at least a portion of the first base layer BS1 are accommodated may be provided in the rotating member RM. A fastening groove RHM into which the first base layer BS1 is fastened may be provided in one area of the rotating member RM.

In some embodiments, a portion of the display panel DP may be accommodated in the rotating member RM or may be physically coupled to the rotating member RM. As shown in FIG. 8, the display panel DP may penetrate (or extend) into the rotating member RM through the fastening groove RHM. The fastening groove RHM may have an arc shape. The display panel DP is not bent but may be naturally curved.

When a portion of the display panel DP is accommodated in the rotating member RM or is coupled to the rotating member RM, any step difference does not occur in a process in which the display panel DP is rolled on the rotating member RM, and the display panel DP can be entirely rolled with a constant curvature. Further, in a process in which the display panel DP is repeatedly rolled and unrolled, a defect (e.g., damage, line resistance change, or the like) caused by bending, contact, or the like of the circuit board PCB can be prevented.

Figure 9:
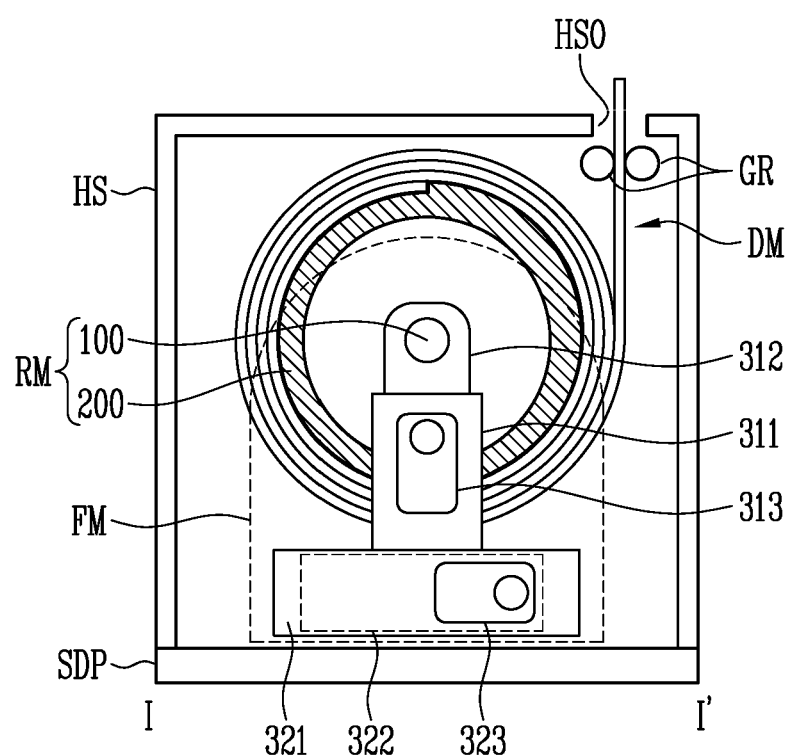
FIGS. 9 to 11 are schematic sectional views taken along the line I-I' in FIG. 1.
Figure 9:
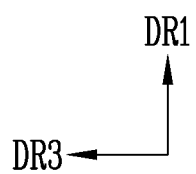
Figure 10:
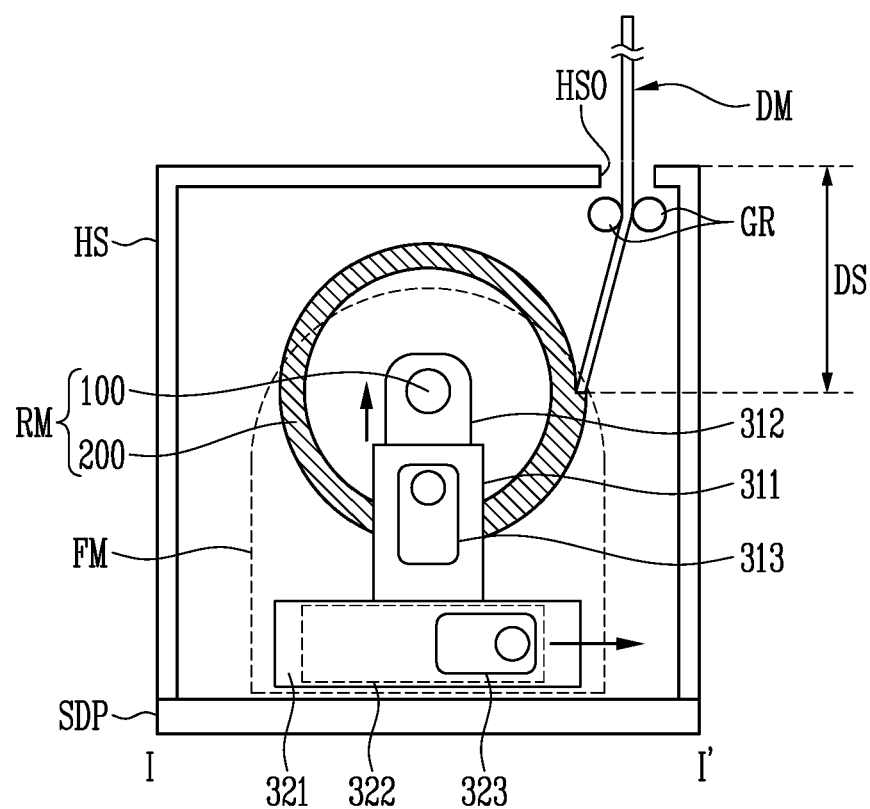
Figure 11:
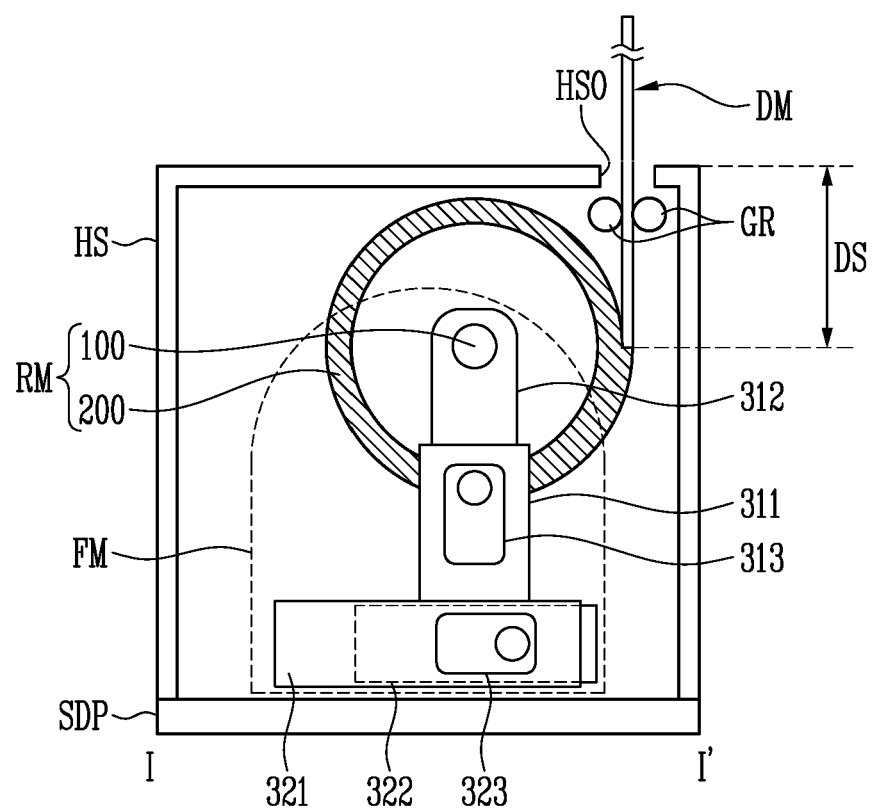

FIGS. 9 to 11 are schematic sectional views taken along the line I-I' in FIG. 1. FIG. 9 illustrates a state in which the display module DM is rolled, and FIGS. 10 and 11 illustrate a state in which the display module DM is unrolled.

Referring to FIGS. 1 to 11, the rotating member RM may include a rotating shaft 100 and a rotating drum 200. The rotating shaft 100 may be disposed at the center (or middle) of the rotating drum 200. As an example, the rotating shaft 100 may penetrate (or may extend through) the rotating drum 200 and extend in one direction.

When the rotating shaft 100 is rotated in one direction (e.g., a first rotational direction), the display module DM may be rolled onto the rotating drum 200. When the rotating shaft 100 is rotated in an opposite direction (e.g., a second rotational direction), the rolled display module DM may be unrolled (or unwound).

In an embodiment, the display device DD may include a plurality of guide rollers GR. The guide rollers GR may guide a moving direction of the display module DM in a process in which the display module DM is finally extracted. The guide roller GR may be located in the housing HS.

The holding member FM may be fixed to an inner side of the housing HS and may support the rotating shaft 100. For example, the rotating member RM (or the rotating shaft 100) may be held to the holding member FM. For example, the holding member FM may be fixed or coupled to one surface of the mounting part SDP, but the present disclosure is not limited. As another example, the holding member FM may be fixed to an inner surface of the housing HS.

In some embodiments, the holding member FM may vary a position of the rotating member RM inside the housing HS.

For example, the holding member FM may move the rotating member RM such that the display module (e.g., the display panel) DM becomes distant from (e.g., moves away from) the slot HSO in a state in which the display module DM is rolled on the rotating member RM. For example, the holding member FM may move the rotating member RM such that the display module (e.g., the display panel) DM becomes close to (e.g., moves toward) the slot HSO in a state in which the display module DM is unrolled.

As shown in FIG. 9, in the state in which the display module DM is rolled on the rotating member RM, the rolled display module DM does not contact the housing HS. Accordingly, the position of the rotating member RM (or the rotating shaft 100) in the housing HS may be set or determined by considering a thickness of the display module DM (e.g., a total thickness of the rolled display module DM). For example, when the area of the display module DM is relatively large, a number of times the display module DM is rolled on the rotating member RM may correspondingly increase (e.g., 10 times or more), and the position of the rotating member RM may be set such that the rotating member RM is sufficiently spaced apart from the housing HS.

As shown in FIG. 10, when the display module DM is unrolled, a dead space DS (or non-driving area) of the display module DM may not be exposed to the outside of the housing HS.

To reduce the dead space DS, the holding member FM may move the rotating member RM such that the display module DM becomes close to the slot HSO in the state in which the display module DM is unrolled. When the display module DM is unrolled, the rotating member RM may be moved to become close by a distance corresponding to the total thickness of the rolled display module DM. The dead space DS may be reduced by the distance the rotating member RM moves (e.g., an area corresponding to the distance the rotating member RM moves). When the dead space DS is reduced, a size of the display module DM (or the display panel DP (see, e.g., FIG. 7)) may be smaller and cutting efficiency of the display module DM (or the display panel DP (see, e.g., FIG. 7)) can be improved. In other words, fabrication cost of the display module DM can be reduced.

In some embodiments, the holding member FM may move the rotating member RM in the first direction DR1. The first direction DR1 may correspond to a direction in which the display module DM (or the display panel DP) is unrolled from the outside of the housing HS. When the rotating member RM becomes close to the slot HSO in the direction in which the display module DM is unrolled, the dead space DS may be reduced. To this end, the holding member FM may include a first block 310, which moves the rotating member RM in the first direction DR1.

For example, the first block 310 may be implemented as a cylinder device. For example, the first block 310 may be implemented as an air cylinder, a gas cylinder, a hydraulic cylinder, or the like and may move the rotating member RM in the first direction DR1.

In an embodiment, the first block 310 may include a first fixing part (e.g., a first guide part) 311, a first moving part 312, and a first driving part 313.

The first fixing part 311 may be directly/indirectly coupled to the housing HS (or the mounting part SDP). For example, when the holding member FM includes a second block 320, which will be described later, the first fixing part 311 may be coupled to the housing HS through the second block 320. In other embodiments, the second block 320 is omitted, and the first fixing part 311 may be directly coupled to the housing HS.

The first moving part 312 may be movably coupled to the first fixing part 311, and the rotating member RM (or the rotating shaft 100) may be directly/indirectly held to the first moving part 312.

The first driving part 313 may provide power to the first moving part 312 to move the first moving part 312 with respect to the first fixing part 311. The first driving part 313 may be separately provided, but the present disclosure is not limited thereto.

For example, when the first block 310 is implemented as the cylinder device, the first fixing part 311 may be a cylinder (or body), the first moving part 312 may be a piston or a plunger and may move along the first direction DR1 in the first fixing part 311, and the first driving part 313 may generate air pressure, oil pressure, or the like, thereby operating the first moving part 312.

Although an embodiment in which the first block 310 is the cylinder device has been described, the first block 310 is not limited thereto. For example, the first block 310 may use (or may include) a motor, a rack and pinion gear, a belt, a chain, and the like.

In some embodiments, the holding member FM may move the rotating member RM in the third direction DR3 (or the opposite direction of the third direction DR3). The third direction DR3 may be perpendicular to the first direction DR1 (and an extending direction of the slot HSO). When an end portion of the display module DM, which is coupled to the rotating member RM, and the slot HSO are located on the same line (or the same plane) corresponding to the direction in which the display module DM is unrolled, the dead space DS may be further reduced. The holding member FM may include the second block 320, which moves the rotating member RM in the third direction DR3 (or the opposite direction of the third direction DR3). For example, the second block 320 may be a cylinder device.

In an embodiment, the second block 320 may include a second fixing part (or second guide part), a second moving part 322, and a second driving part 323.

The second fixing part 321 may be directly/indirectly coupled to the housing HS (or the mounting part SDP).

The second moving part 322 may be movably coupled to the second fixing part 321. The rotating member RM (or the rotating shaft 100) may be held to the second moving part 322. For example, when the holding member FM includes the first block 310, which will be described in more detail later, the rotating member RM may be held to the second moving part 322 through the first block 310. In other embodiments, the first block 310 is omitted, the second moving part 322 may have a shape corresponding to the first block 310, and the rotating member RM may be directly held to the second moving part 322.

The second driving part 323 may power the second moving part 322 to move the second moving part 322 with respect to the second fixing part 321. The second driving part 323 may be separately provided, but the present disclosure is not limited thereto. For example, the second driving part 323 may be integrally formed with the first driving part 313.

The second fixing part 321, the second moving part 322, and the second driving part 323 are respectively configured substantially identical or similar to the first fixing part 311, the first moving part 312, and the first driving part 313, respectively, and therefore, overlapping descriptions will not be repeated.

In an embodiment, at least one of the first block 310 and the second block 320 may be operated in a state in which the display module DM is completely unrolled.

For example, as shown in FIGS. 9 and 10, when the display module DM is changed from the state in which the display module DM is rolled to the state in which the display module DM is completely unrolled, the first block 310 may move the display module DM in the first direction DR1, and the second block 320 may move the display module DM in the opposite direction of the third direction DR3. The first block 310 and the second block 320 may be concurrently, simultaneously, or sequentially operated.

In another embodiment, when the display module DM starts being rolled from the state in which the display module DM is unrolled, the first block 310 may the display module DM in the opposite direction of the first direction DR1, and the second block 320 may move the display module DM in the third direction DR3, before the display module DM is rolled (or substantially rolled).

For example, the holding member FM may move the rotating member RM to become close to the slot HSO after the display module DM is completely unrolled. Also, after the holding member FM moves the rotating member RM to become distant from the slot HSO in the state in which the display module DM is unrolled, the rotating member RM may roll the display module DM thereon. In a state in which the display module DM is not completely unrolled, the display module DM is not damaged due to a malfunction of the holding member FM.

In another embodiment, while the rotating member RM rolls and unrolls the display module DM, at least one of the first block 310 and the second block 320 may vary a position of the display module DM.

For example, when the display module DM starts being unrolled from the state in which the display module DM is rolled, the first block 310 may move the display module DM in the first direction DR1, and the second block 320 may move the display module DM in the opposite direction of the third direction DR3, corresponding to a ratio at which the display module DM is unrolled (or a number of times the rotating member RM is rotated in the second rotational direction).

In another embodiment, when the display module DM starts being rolled from the state in which the display module DM is unrolled, the first block 310 may move the display module DM in the opposite direction of the first direction DR1, and the second block 320 may move the display module DM in the third direction DR3, corresponding to a ratio at which the display module DM is rolled (or a number of times the rotating member RM is rotated in the first rotational direction).

While the rotating member RM rolls and unrolls the display module DM, the holding member FM may move the rotating member RM. Conversion (or change) between the state in which the display module DM is completely rolled and the state in which the display module DM is completely unrolled can be more rapidly performed.

As described above, the holding member FM may vary the position of the rotating member RM inside the housing HS. Accordingly, the dead space of the display module DM (or the display panel DP) can be reduced, and the fabrication cost of the display module DM (and the display device DD) can be reduced.

In a method of driving the display device, according to embodiments of the present disclosure, the display panel DP (see, e.g., FIG. 7) (or the display module DM) may be unrolled from (or by) the rotating member RM, the rotating member RM may be moved to become close to the slot HSO through the holding member FM. Conversely, the display panel DP is rolled on (or by) the rotating member RM, and the rotating member RM may be moved to become distant from the slot HSO through the holding member FM.

As described above, in the method, the rotating member RM may be moved to become close to the slot HSO after the display panel DP is completely unrolled.

Also, in the method, the display panel DP may be rolled after the rotating member RM is moved to become distant from the slot HSO in the state in which the display panel DP is unrolled.

In another embodiment, the position of the rotating member RM may be varied while the rotating member RM rolls and unrolls the display panel DP.

Figure 12A:
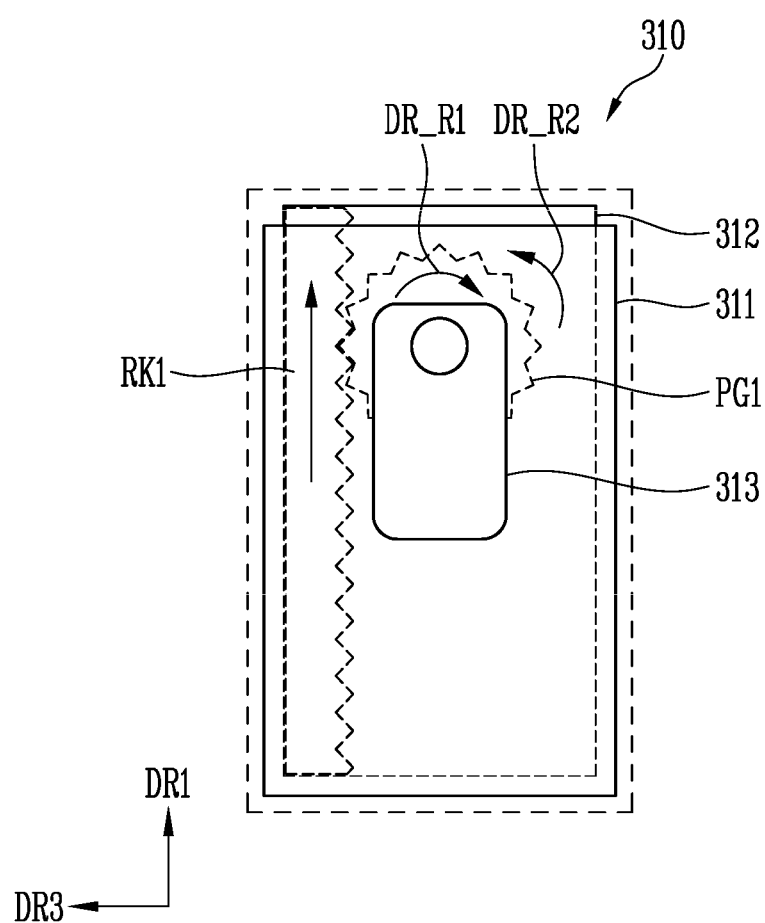
FIGS. 12A and 12B are sectional views illustrating an embodiment of a first block included in the display device shown in FIG. 10.
Figure 12B:
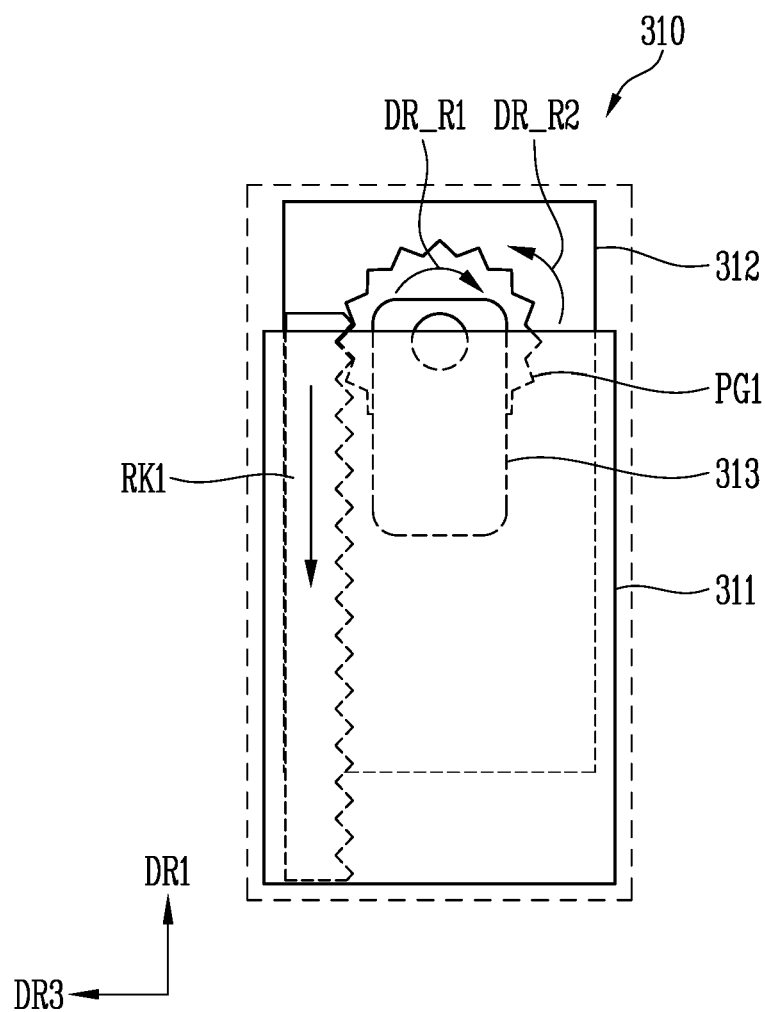
Figure 13A:
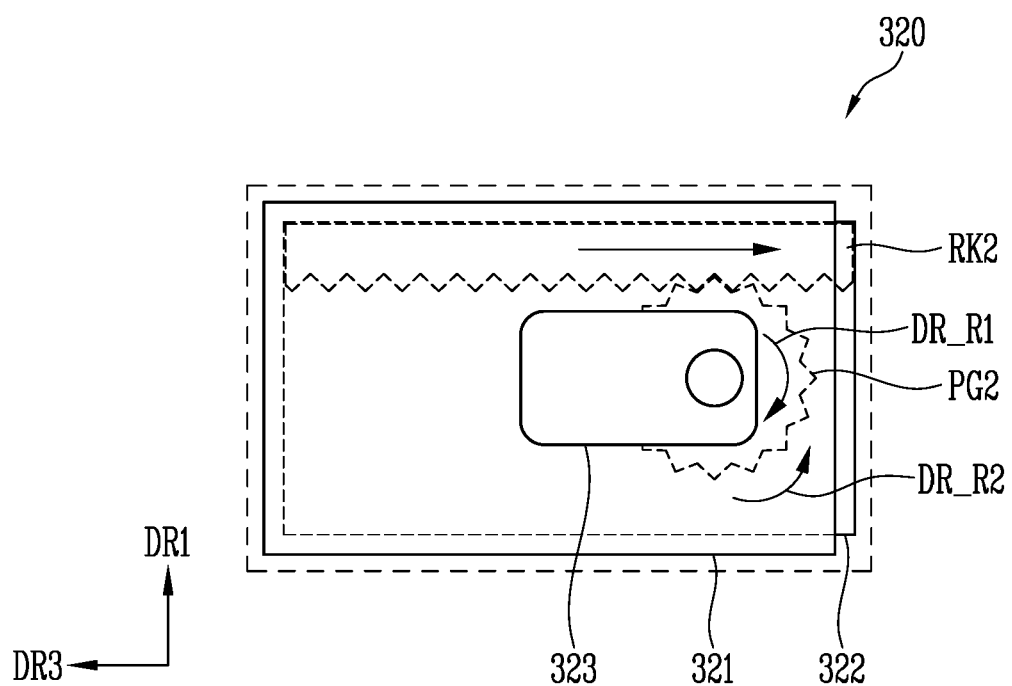
FIGS. 13A and 13B are sectional views illustrating an embodiment of a second block included in the display device shown in FIG. 10.
Figure 13B:
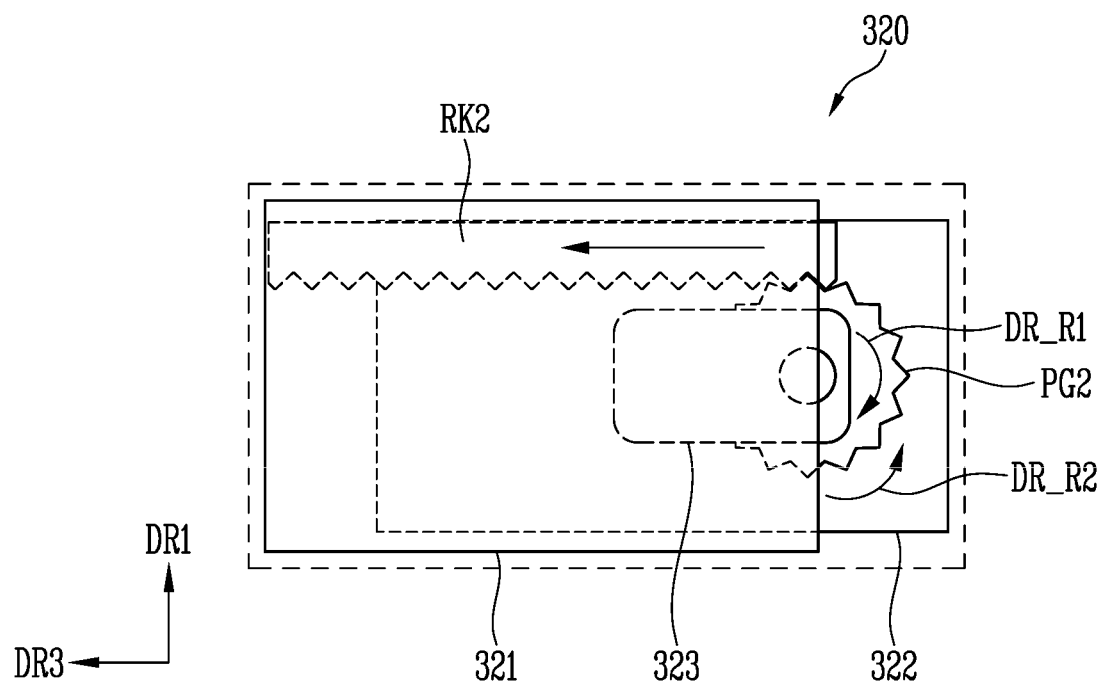

FIGS. 12A and 12B are sectional views illustrating an embodiment of the first block included in the display device shown in FIG. 10. FIGS. 13A and 13B are sectional views illustrating an embodiment of the second block included in the display device shown in FIG. 10.

First, referring to FIGS. 10 to 12A, the first block 310 may include a first rack (e.g., a rack gear) RK1 and a first pinion gear PG1.

In an embodiment, the first moving part 312 may include the first rack RK1 extending in the first direction DR1. The first rack RK1 may be fixed to a body of the first moving part 312. The first fixing part 311 may include the first pinion gear PG1 engaged with the first rack RK1. The first pinion gear PG1 may be fixed to the first fixing part 311.

For example, the first driving part 313 may be a motor and may rotate the first pinion gear PG1. When the first pinion gear PG1 is rotated in a first rotational direction DR_R1 by the first driving part 313, the first rack RK1 (and the first moving part 312) may be moved in the first direction DR1. When the first pinion gear PG1 is rotated in a second rotational direction DR_R2 by the first driving part 313, the first rack RK1 (and the first moving part 312) may be moved in the opposite direction of the first direction DR1.

In some embodiments, the first driving part 313 may rotate the rotating member RM (see, e.g., FIG. 10). For example, the first block 310 may be operated by a driving part that rotates the rotating member RM. For example, a pinion gear may be coupled to the driving part in various ways (e.g., a gear, a belt, and the like) and the driving part may power the first pinion gear PG1. When the first pinion gear PG1 is fixedly coupled to the driving part, the first moving part 312 may be moved while the display module DM is rolled and unrolled.

In another embodiment, as shown in FIG. 12B, the first moving part 312 may include the first rack RK1 and the first pinion gear PG1. The first pinion gear PG1 may be fixed to the first moving part 312. The first rack RK1 is not fixed to the first moving part 312 and the first fixing part 311 but may be guided by the first moving part 312 (e.g., an inner surface of the first moving part 312).

For example, when the first pinion gear PG1 is rotated in the second rotational direction DR_R2 by the first driving part 313, the first rack RK1 may be moved in the opposite direction of the first direction DR1. As the first pinion gear PG1 is rotated in the second rotational direction DR_R2, the first rack RK1 may push a bottom surface of the first fixing part 311 while penetrating a lower end portion of the first moving part 312. Because the first fixing part 311 is fixed, the first moving part 312 instead of the first fixing part 311 may be moved in the first direction DR1. For example, a length of the first rack RK1 in the first direction DR1 (or a distance from the first rack RK1 to the bottom surface of the first fixing part 311) may be set corresponding to a time for the display module DM to be completely unrolled. After the display module DM is completely unrolled, the first moving part 312 may be moved in the first direction DR1. In a similar manner, after the display module DM is completely rolled, the first block 310 may be configured such that the first moving part 312 is moved in the opposite direction of the first direction DR1.

As described above, the first block 310 may move the first moving part 312 (and the rotating member RM held to the first moving part 312) in the first direction DR1 by using the first rack RK1 and the first pinion gear PG1. In addition, the driving part, which drives the rotating member RM, may be used as the first driving part 313, and the first pinion gear PG1 may be fixed to the first fixing part 311 so that the rotating member RM can be moved while the display module DM is rolled and unrolled. In another embodiment, the first pinion gear PG1 may be fixed to the first moving part 312 so that the rotating member RM can be moved after the display module DM is unrolled or before the display module DM is rolled.

Referring to FIGS. 10 and 13A, the second block 320 may include a second rack (e.g., a rack gear) RK2 and a second pinion gear PG2.

In an embodiment, the second moving part 322 may include the second rack RK2 extending in the third direction DR3. The second rack RK2 may be fixed to a body of the second moving part 322. The second fixing part 321 may include the second pinion gear PG2 engaged with the second rack RK2. The second pinion gear PG2 may be fixed to the second fixing part 321.

For example, the second driving part 323 may be a motor and may rotate the second pinion gear PG2. The second pinion gear PG2 is rotated in the first rotational direction DR_R1 or the second rotational direction DR_R2 by the second driving part 323 so that the second rack RK2 (and the second moving part 322) can be moved in the opposite direction of the third direction DR3 or the third direction DR3.

In some embodiments, a driving part (e.g., a driver), which rotates the rotating member RM (see, e.g., FIG. 10), may be used as the second driving part 323. When the second pinion gear PG2 is fixedly coupled to the driving part, the second moving part 322 may be moved while the display module DM is rolled and unrolled.

In another embodiment, as shown in FIG. 13B, the second moving part 322 may include the second rack RK2 and the second pinion gear PG2. The second pinion gear PG2 may be fixed to the second moving part 322. The second rack RK2 is not fixed to the second moving part 322 and the second fixing part 321 but may be guided by the second moving part 322 (e.g., an inner surface of the first moving part 321).

For example, when the second pinion gear PG2 is rotated in the second rotational direction DR_R2, the second rack RK2 may be moved in the third direction DR3 and may push a left inner wall of the second fixing part 321. Because the second fixing part 321 is fixed, the second moving part 322, instead of the second fixing part 321, may be moved in the opposite direction of the third direction DR3. For example, a length of the second rack RK2 in the third direction DR3 (or a distance from the second rack RK2 to the left inner wall of the second fixing part 321) may be set corresponding to a time for the display module DM to be completely unrolled. After the display module DM is completely unrolled, the second moving part 322 may be moved in the opposite direction of the third direction DR3. In a similar manner, after the display module DM is completely rolled, the second block 320 may be configured such that the second moving part 322 is moved in the third direction DR3.

As described above, the second block 320 may move the second moving part 322 (and the rotating member RM indirectly held to the second moving part 322) in the third direction DR3 by using the second rack RK2 and the second pinion gear PG2. In addition, the driving part, which drives the rotating member RM, may be used as the second driving part 323, and the second pinion gear PG2 may be fixed to the second fixing part 321 so that the rotating member RM can be moved while the display module DM is rolled and unrolled. In another embodiment, the second pinion gear PG2 may be fixed to the second moving part 322 so that the rotating member RM can be moved after the display module DM is unrolled or before the display module DM is rolled.

Figure 14:
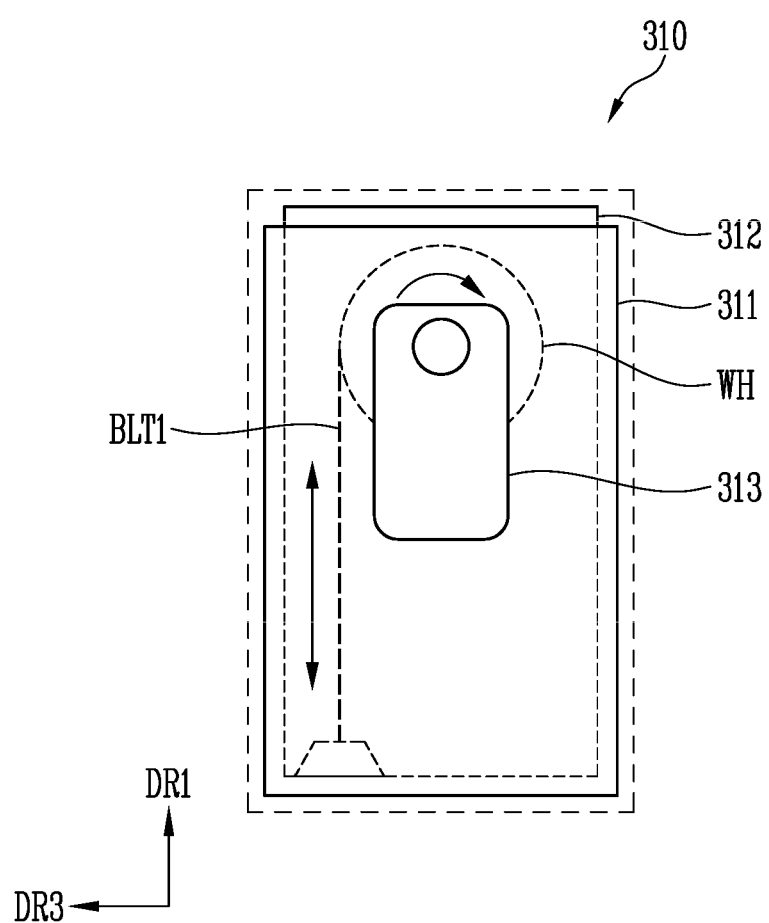
FIG. 14 is a sectional view illustrating another embodiment of the first block included in the display device shown in FIG. 10.
Figure 15:
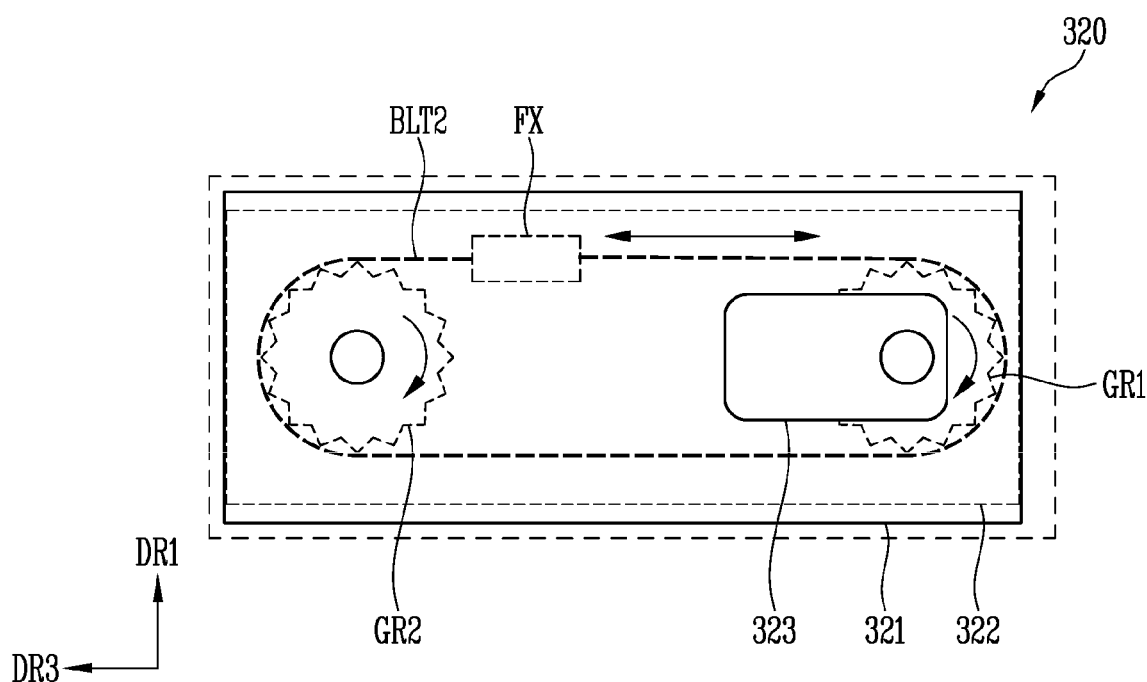
FIG. 15 is a sectional view illustrating another embodiment of the second block included in the display device shown in FIG. 10.

FIG. 14 is a sectional view illustrating another embodiment of the first block included in the display device shown in FIG. 10. FIG. 15 is a sectional view illustrating another embodiment of the second block included in the display device shown in FIG. 10.

First, referring to FIGS. 10 and 14, the first block 310 may include a first belt (e.g., a first chain) BLT1 and a wheel WH.

In an embodiment, one end of the first belt BLT1 may be coupled or fixed to the first fixing part 311 (or the bottom surface of the first fixing part 311), and the other end of the first belt BLT1 may be fixed or coupled to the wheel WH. The wheel WH may be rotatably coupled to the first fixing part 311.

When the wheel WH is rotated by the first driving part 313, the first belt BLT1 may be rolled on the wheel WH or unrolled from the wheel WH. Accordingly, the first moving part 312 may be moved in the first direction DR1 or the opposite direction of the first direction DR1.

Referring to FIGS. 10 and 15, the second block 320 may include a second belt (e.g., a conveyer belt) BLT2, a first gear (e.g., a first wheel) GR1, and a second gear (e.g., a second wheel) GR2.

In an embodiment, the second belt BLT2 may move along a loop around the first and second gears GR1 and GR2, which are spaced apart from each other. The second belt BLT2 may be cyclically moved along the loop according to rotation of the first and second gears GR1 and GR2.

The first block 310 (or the rotating member RM) shown in FIG. 10 may be coupled to one portion FX (or one area) of the second belt BLT2. As the one portion FX of the second belt BLT2 is moved in the third direction DR3, the first block 310 (or the rotating member RM) may be moved in the third direction DR3.

As described above, the first block 310 and the second block 320 may move the rotating member RM by using a belt (or chain).

Figure 16:
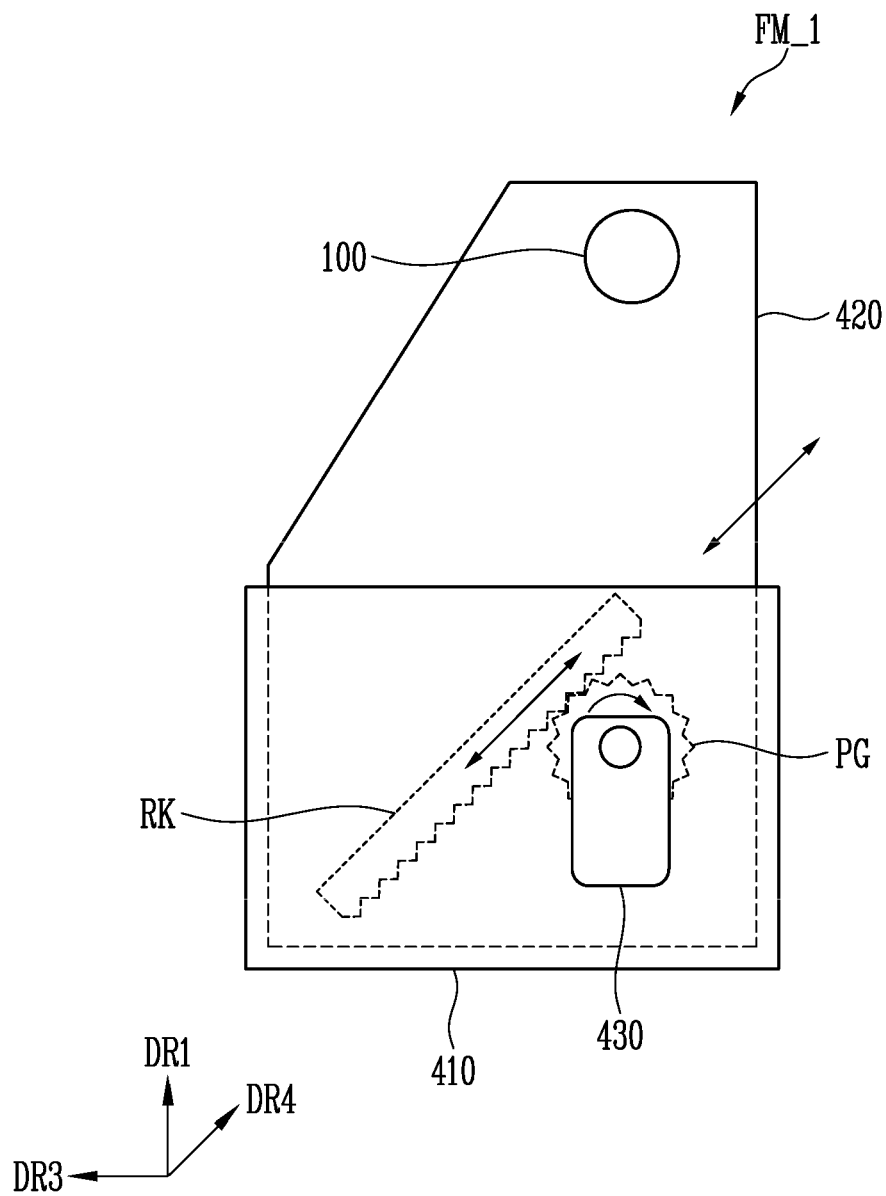
FIG. 16 is a sectional view illustrating another embodiment of a holding member included in the display device shown in FIG. 10.

FIG. 16 is a sectional view illustrating another embodiment of the holding member included in the display device shown in FIG. 10.

Referring to FIGS. 9 to 16, a holding member FM_1 may move the rotating member RM in a fourth direction DR4. The fourth direction DR4 may be a direction corresponding to the shortest distance from the rotating member RM (or the rotating shaft 100 of the rotating member RM) to the slot HSO.

The holding member FM_1 may include a third fixing part (e.g., a third guide part) 410, a third moving part 420, and a third driving part 430.

The third fixing part 410 may be fixed or coupled to the housing HS (or the mounting part SDP).

The third moving part 420 may be movably coupled to the third fixing part 410, and the rotating member RM (or the rotating shaft 100) may be directly/indirectly held to the third moving part 420.

The third driving part 430 may provide power to the third moving part 420, thereby moving the third moving part 420 with respect to the third fixing part 410. The third driving part 430 may be independently provided, but the present disclosure is not limited thereto. For example, the third driving part 430 may be integrally formed with a driving part which rotates the rotating member RM.

Similarly to the first block 310 described above with reference to FIGS. 9 to 11, the holding member FM_1 may be a cylinder device, but the present disclosure is not limited thereto.

In an embodiment, the holding member FM_1 may include a rack (e.g., a rack gear) RK and a pinion gear PG.

The rack RK may extend in the fourth direction DR4 and may be fixed to a body of the third moving part 420.

The third fixing part 410 may include the pinion gear PG engaged with the rack RK. The pinion gear PG may be fixed to the third fixing part 410.

For example, the third driving part 430 may be a motor to rotate the pinion gear PG. The pinion gear PG may be rotated by the third driving part 430 so that the rack RK (and the third moving part 420) can be moved in the fourth direction DR4 and the opposite direction of the fourth direction DR4.

As described with reference to FIGS. 12A to 13B, the holding member FM_1 may move the rotating member RM when the display module DM is rolled and unrolled. In another embodiment, the holding member FM_1 may move the rotating member RM after the display module DM is unrolled or before the display module DM is rolled.

Although an embodiment in which the holding member FM_1 uses the rack RK and the pinion gear PG has been described in connection with FIG. 16, the present disclosure is not limited thereto. As described with reference to FIGS. 14 and 15, the holding member FM_1 may move the rotating member RM in the fourth direction DR4 by using a belt, a chain, or the like.

Figure 17:
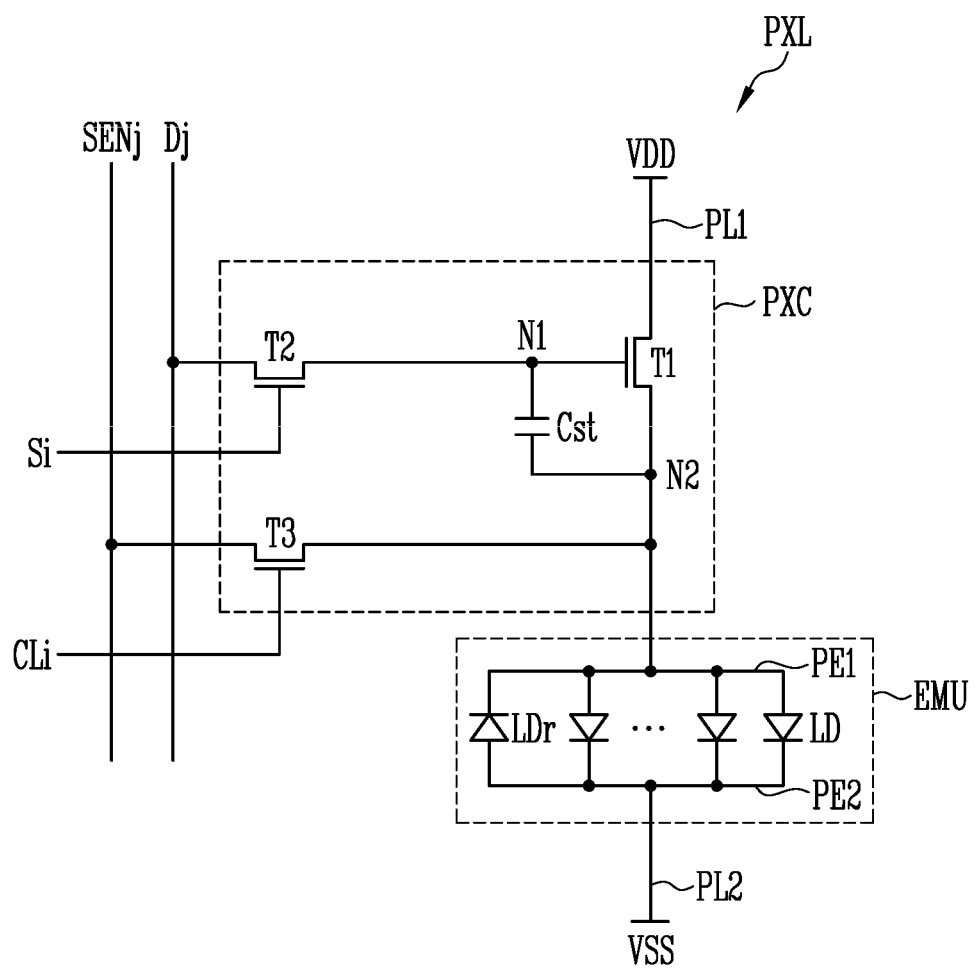
FIG. 17 is a circuit diagram illustrating an electrical connection relationship of components included in a pixel shown in FIG. 6.

FIG. 17 is a circuit diagram illustrating an electrical connection relationship of components included in the pixel shown in FIG. 6.

For example, FIG. 17 illustrates an electrical connection relationship between components included in a pixel PXL, which may be part of an active matrix type display device. However, the electrical connection relationship between the components included in the pixel PXL applicable to embodiments of the present disclosure is not limited thereto.

Referring to FIGS. 6 and 17, the pixel PXL may include a light emitting unit (e.g., a light emitting part) EMU, which generates light with a luminance corresponding to a data signal. Also, the pixel PXL may further include a pixel circuit PXC for driving the light emitting unit EMU.

In some embodiments, the light emitting unit EMU may include a plurality of light emitting elements LD connected in parallel between a first power line PL1 connected to a first driving power source VDD to be applied with a voltage of the first driving power source VDD and a second power line PL2 connected to a second driving power source VSS to be applied with a voltage of the second driving power source VSS. For example, the light emitting unit EMU may include a first pixel electrode PE1 connected to the first driving power source VDD via the pixel circuit PXC and the first power line PL1, a second pixel electrode PE2 connected to the second driving power source VSS through the second power line PL2, and a plurality of light emitting elements LD connected in parallel in the same direction between the first and second pixel electrodes PE1 and PE2. In an embodiment, the first pixel electrode PE1 may be an anode, and the second pixel electrode PE2 may be a cathode.

Each of the light emitting elements LD included in the light emitting unit EMU may have one end portion connected to the first driving power source VDD through the first pixel electrode PE1 and another (e.g., an opposite) end portion connected to the second driving power source VSS through the second pixel electrode PE2. The first driving power source VDD and the second driving power source VSS may have different potentials. In an embodiment, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the pixel PXL.

As described above, the light emitting elements LD connected in parallel in the same direction (e.g., a forward direction) between the first pixel electrode PE1 and the second pixel electrode PE2, to which voltages having difference potentials are supplied, may form respective effective light sources.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through each of the light emitting elements LD. Accordingly, the light emitting unit EMU can emit light with a luminance corresponding to the driving current while each light emitting element LD is emitting light with a luminance corresponding to a current flowing therethrough.

Although an embodiment in which both end portions of the light emitting elements LD are connected in the same direction between the first and second driving power sources VDD and VSS has been described, the present disclosure is not limited thereto. In some embodiments, the light emitting unit EMU may further include at least one ineffective light source (e.g., a reverse light emitting element LDr) in addition to the light emitting elements LD forming the respective effective light sources. The reverse light emitting element LDr is connected in parallel together with the light emitting elements LD forming the effective light sources between the first and second pixel electrodes PE1 and PE2 but may be connected between the first and second pixel electrodes PE1 and PE2 in a direction opposite to that in which the light emitting elements LD are connected. Although a driving voltage (e.g., a forward driving voltage) is applied between the first and second pixel electrodes PE1 and PE2, the reverse light emitting element LDr maintains an inactivated state, and accordingly, no substantial current flows through the reverse light emitting element LDr.

The pixel circuit PXC may be connected to a scan line Si and a data line Dj of the pixel PXL. Also, the pixel circuit PXC may be connected to a control line CLi and a sensing line SENj of the pixel PXL. In an embodiment, when the pixel PXL is disposed on an ith row and a jth column of the display area DA, the pixel circuit PXC of the pixel PXL may be connected an ith scan line Si, a jth data line Dj, an ith control line CLi, and a jth sensing line SENj of the display area DA.

The pixel circuit PXC may include first to third transistors T1 to T3 and a storage capacitor Cst.

The first transistor T1 is a driving transistor for controlling a driving current applied to the light emitting unit EMU and may be connected between the first driving power source VDD and the light emitting unit EMU. A first terminal of the first transistor T1 may be connected (or coupled) to the first driving power source VDD through the first power line PL1, a second terminal of the first transistor T1 may be connected to a second node N2, and a gate electrode of the first transistor T1 may be connected to a first node N1. The first transistor T1 may control an amount of driving current applied to the light emitting unit EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the present disclosure is not limited thereto. In some embodiments, the first terminal may be the source electrode, and the second terminal may be the drain electrode.

The second transistor T2 is a switching transistor, which selects a pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 are different terminals. For example, when the first terminal is a drain electrode, the second terminal may be a source electrode.

The second transistor T2 may be turned on when a scan having a gate-on voltage (e.g., a high level voltage) is supplied from the scan line Si to electrically connect the data line Dj and the first node N1 to each other. The first node N1 is a point at which the second terminal of the second transistor T2 and the gate electrode of the first transistor T1 are connected to each other, and the second transistor T2 may transfer a data signal to the gate electrode of the first transistor T1.

The third transistor T3 connects the first transistor T1 to the sensing line SENj to acquire a sensing signal through the sensing line SENj and to detect a characteristic of the pixel PXL, including a threshold voltage of the first transistor, or the like, by using the sensing signal. Information on the characteristic of the pixel PXL may be used to convert image data such that a characteristic deviation between pixels PXL can be compensated. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. Also, the first terminal of the third transistor T3 may be connected to an initialization power source. The third transistor T3 is an initialization transistor capable of initializing the second node N2. The third transistor T3 may be turned on when a sensing control signal is supplied from the control line CLi to transfer a voltage of the initialization power source to the second node N2. Accordingly, a second storage electrode of the storage capacitor Cst, which is connected to the second node N2, may be initialized.

A first storage electrode of the storage capacitor Cst may be connected to the first node N1, and the second storage electrode of the storage capacitor Cst may be connected to the second node N2. The storage capacitor Cst charges a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

Although an embodiment in which the light emitting elements LD constituting the light emitting unit EMU are all connected in parallel has been illustrated in FIG. 17, the present disclosure is not limited thereto. In some embodiments, the light emitting unit EMU may include at least one serial stage (or stage) including a plurality of light emitting elements LD connected to each other in parallel. For example, the light emitting unit EMU may be configured in a series/parallel hybrid structure.

Figure 18:
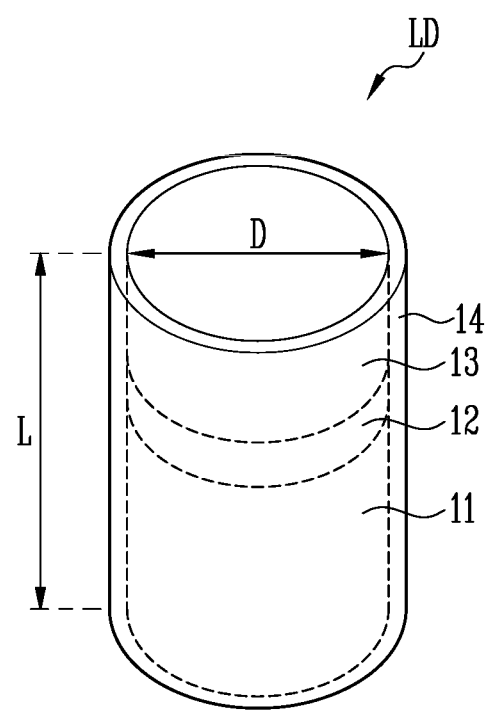
FIG. 18 is a perspective view schematically illustrating a light emitting element included in the pixel shown in FIG. 17.

FIG. 18 is a perspective view schematically illustrating the light emitting element included in the pixel shown in FIG. 17.

The kind and/or shape of the light emitting element LD is not limited to the embodiment shown in FIG. 18.

Referring to FIGS. 17 and 18, the light emitting element LD may include a first semiconductor layer 11, a second semiconductor layer 13, and an active layer 12 interposed between the first and second semiconductor layers 11 and 13. The light emitting element LD may be implemented with a light emitting stack structure (or stack pattern) in which the first semiconductor layer 11, the active layer 12, and the second semiconductor layer 13 are sequentially stacked.

The light emitting element LD may be provided in a shape extending in one direction. When an extending direction of the light emitting element LD is a length direction, the light emitting element LD may have a first end portion and a second end portion along the length direction. Any one of the first and second semiconductor layers 11 and 13 may be disposed at the first end portion of the light emitting element LD, and the other of the first and second semiconductor layers 11 and 13 may be disposed at the second end portion of the light emitting element LD. In an embodiment, the first semiconductor layer 11 may be disposed at the first end portion of the light emitting element LD, and the second semiconductor layer 13 may be disposed at the second end portion of the light emitting element LD.

The light emitting element LD may be provided in various shapes. For example, the light emitting element LD may have a rod-like shape, a bar-like shape, a pillar-like shape, or the like, which is long in its length direction (e.g. having an aspect ratio greater than 1) as shown in, for example, FIG. 18. In another example, the light emitting element LD may have a rod-like shape, a bar-like shape, a pillar-like shape, or the like, which is short in its length direction (e.g., having an aspect ratio smaller than 1). In another embodiment, the light emitting element LD may have a rod-like shape, a bar-like shape, a pillar-like shape, or the like, having an aspect ratio of 1.

The light emitting element LD may include, for example, a light emitting diode (LED) having a diameter D and/or a length L to a degree of nano scale (or nanometer) to micrometer scale (or micrometer).

When the light emitting element LD is long in its length direction (e.g., having an aspect ratio greater than 1), the diameter D of the light emitting element LD may be in a range of about 0.5 μm to about 6 μm, and the length L of the light emitting element LD may be in a range of about 1 μm to about 10 μm. However, the diameter D and the length L of the light emitting element LD are not limited thereto, and the size of the light emitting element LD may be varied according to various conditions (including design conditions) of a lighting device or a self-luminous display device, to which the light emitting element LD is applied.

The first semiconductor layer 11 may include, for example, at least one n-type semiconductor layer. For example, the first semiconductor layer 11 may include any one semiconductor material from among InAlGaN, GaN, AlGaN, InGaN, AlN, and InN, and may include an n-type semiconductor layer doped with a first conductive dopant (or n-type dopant), such as Si, Ge or Sn. However, the material of the first semiconductor layer 11 is not limited thereto. The first semiconductor layer 11 may be formed with (or may include) various materials. The first semiconductor layer 11 may have an upper surface in contact with the active layer 12 and a lower surface exposed to the outside along the length direction of the light emitting element LD. The lower surface of the first semiconductor layer 11 may be the one end portion (or lower end portion) of the light emitting element LD.

The active layer 12 is formed on the first semiconductor layer 11 and may be formed in a single or multiple quantum well structure. When the active layer 12 has the multiple quantum well structure, a barrier layer, a strain reinforcing layer, and a well layer, which constitute one unit, may be periodically and repeatedly stacked in the active layer 12. The strain reinforcing layer may have a lattice constant smaller than that of the barrier layer to further reinforce strain (e.g., compressive strain) applied to the well layer. However, the structure of the active layer 12 is not limited to the above-described embodiment.

The active layer 12 may emit light having a wavelength in a range of about 400 nm to about 900 nm and may have a double hetero structure. In an embodiment, a clad layer doped with a conductive dopant may be formed on the top and/or the bottom of the active layer 12 along the length direction of the light emitting element LD. In an embodiment, the clad layer may be formed as an AlGaN layer or InAlGaN layer. In some embodiments, a material, such as AlGaN or AlInGaN, may be used to form the active layer 12. The active layer 12 may be formed with (or may include) various materials. The active layer 12 may have a first surface in contact with the first semiconductor layer 11 and a second surface in contact with the second semiconductor layer 13.

When an electric field having a voltage (e.g., a reference or predetermined voltage) or more is applied to both the end portions of the light emitting element LD, the light emitting element LD emits light as electron-hole pairs are combined in the active layer 12. The light emission of the light emitting element LD is controlled according to such a principle so that the light emitting element LD can be used as a light source (or light emitting source) for various light emitting devices, including a pixel of a display device.

The second semiconductor layer 13 is formed on the second surface of the active layer 12 and may include a semiconductor layer having a type different from that of the first semiconductor layer 11. In an embodiment, the second semiconductor layer 13 may include at least one p-type semiconductor material. For example, the second semiconductor layer 13 may include at least one semiconductor material from among InAlGaN, GaN, AlGaN, InGaN, AlN, and InN and may include a p-type semiconductor layer doped with a second conductive dopant (or p-type dopant), such as Mg, Zn, Ca, Sr or Ba. However, the material of the second semiconductor layer 13 is not limited thereto. The second semiconductor layer 13 may be formed with (or may include) various materials. The second semiconductor layer 13 may have a lower surface in contact with the second surface of the active layer 12 and an upper surface exposed to the outside along the length direction of the light emitting element LD. The upper surface of the second semiconductor layer 13 may be the other end portion (or upper end portion) of the light emitting element LD.

In an embodiment, the first semiconductor layer 11 and the second semiconductor layer 13 may have different thicknesses in the length direction of the light emitting element LD. In an example, the first semiconductor layer 11 may have a thickness relatively greater (e.g., thicker) than that of the second semiconductor layer 13 along the length direction of the light emitting element LD. Accordingly, the active layer 12 of the light emitting element LD may be located more adjacent to (or nearer to) the upper surface of the second semiconductor layer 13 than the lower surface of the first semiconductor layer 11.

Although each of the first semiconductor layer 11 and the second semiconductor layer 13 are shown as being one layer in the illustrated embodiment, the present disclosure is not limited thereto. In an embodiment, each of the first semiconductor layer 11 and the second semiconductor layer 13 may further include at least one layer (e.g., a clad layer and/or a Tensile Strain Barrier Reducing (TSBR) layer) according to the material of the active layer 12. The TSBR layer may be a strain reducing layer disposed between semiconductor layers having different lattice structures to act as a buffering layer to reduce a lattice constant difference. The TSBR layer may be configured with a p-type semiconductor layer, such as p-GAInP, p-AlInP or p-AlGaInP, but the present disclosure is not limited thereto.

In some embodiments, the light emitting element LD may further include a contact electrode (hereinafter, referred to as a "first contact electrode") disposed on the top of the second semiconductor layer 13, in addition to the first semiconductor layer 11, the active layer 12, and the second semiconductor layer 13, which are described above. In other embodiments, the light emitting element LD may further include another contact electrode (hereinafter, referred to as a "second contact electrode") disposed at one end of the first semiconductor layer 11.

Each of the first and second contact electrodes may be an ohmic contact electrode, but the present disclosure is not limited thereto. In some embodiments, each of the first and second contact electrodes may be a Schottky contact electrode. The first and second contact electrodes may include a conductive material. For example, the first and second contact electrodes may include an opaque metal including one or mixture of chromium (Cr), titanium (Ti), aluminum (Al), gold (Au), nickel (Ni), and any oxide or alloy thereof, but the present disclosure is not limited thereto. In some embodiments, the first and second contact electrodes may include a transparent conductive oxide, such as indium tin oxide (ITO), indium zinc oxide (IZO), zinc oxide (ZnO), indium gallium zinc oxide (IGZO), or indium tin zinc oxide (ITZO).

Materials respectively included in the first and second contact electrodes may be identical to or different from each other. The first and second contact electrodes may be substantially transparent or translucent. Accordingly, light generated in the light emitting element LD can be emitted to the outside of the light emitting element LD by passing through the first and second contact electrodes. In some embodiments, when light generated in the light emitting element LD does not pass through the first and second contact electrodes and is emitted to the outside of the light emitting element LD through an area except both the end portions of the light emitting element LD, the first and second contact electrodes may include an opaque metal.

In an embodiment, the light emitting element LD may further include an insulative film (e.g., an insulating film) 14. However, in some embodiments, the insulative film 14 may be omitted or may be provided to cover only portions of the first semiconductor layer 11, the active layer 12, and the second semiconductor layer 13.

The insulative film 14 prevents an electrical short circuit, which may occur when the active layer 12 contacts a conductive material in addition to the first semiconductor layer 11 and the second semiconductor layer 13. Also, the insulative film 14 reduces or minimizes a surface defect of the light emitting element LD, thereby improving the lifespan and light emission efficiency of the light emitting element LD. Also, when a plurality of light emitting elements LD are densely disposed, the insulative film 14 prevents an unwanted short circuit, which may occur between the light emitting elements LD. Whether the insulative film is provided is not limited as long as the active layer 12 can prevent occurrence of a short circuit with external conductive material.

The insulative film 14 may entirely surround an outer circumferential surface of the light emitting stack structure including the first semiconductor layer 11, the active layer 12, and the second semiconductor layer 13.

Although an embodiment in which the insulative film 14 entirely surrounds (or extends around) an outer circumferential surface of each of the first semiconductor layer 11, the active layer 12, and the second semiconductor layer 13 is described above, the present disclosure is not limited thereto. In some embodiments, when the light emitting element LD includes the first contact electrode, the insulative film 14 may entirely surround an outer circumferential surface of each of the first semiconductor layer 11, the active layer 12, the second semiconductor layer 13, and the first contact electrode. In other embodiments, the insulative film 14 may not entirely surround the outer circumferential surface of the first contact electrode, or may surround only a portion of the outer circumferential surface of the first contact electrode and may not surround the other of the outer circumferential surface of the first contact electrode. In some embodiments, when the first contact electrode is disposed at the other end portion (or upper end portion) of the light emitting element LD and the second contact electrode is disposed at one end portion (or the other end portion) of the light emitting element LD, the insulative film 14 may expose at least one area of each of the first and second contact electrodes.

The insulative film 14 may include a transparent insulating material. The insulative film 14 may be provided in the form of a single layer or may be provided in the form of a multi-layer including at least two layers. In an embodiment, when the insulative film 14 is a double layer structure including a first insulating layer and a second insulating layer, which are sequentially stacked, the first insulating layer and the second insulating layer may be made of different materials (or ingredients) and may be formed through different processes. In some embodiments, the first insulating layer and the second insulating layer may be formed of the same material through a continuous process.

The above-described light emitting element LD may be used as a light emitting source (or light source) for the display device DD. The light emitting element LD may be manufactured through a surface treatment process. For example, when a plurality of light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD are not unequally condensed in the solution but equally dispersed in the solution.

A light emitting unit (or light emitting device) including the above-described light emitting element LD may be used in various types of devices that include a light source, including the display device DD. When a plurality of light emitting elements LD are disposed in an emission area of each pixel PXL of the display panel DP, the light emitting elements LD may be used as a light source of the pixel PXL. However, the application field of the light emitting element LD is not limited to the above-described example. For example, the light emitting element LD may be used for other types of electronic devices that require a light source, such as a lighting device.

Hereinafter, an embodiment of the pixel PXL using the above-described light emitting element LD as a light source will be described with reference to FIGS. 19 and 20.

Figure 19:
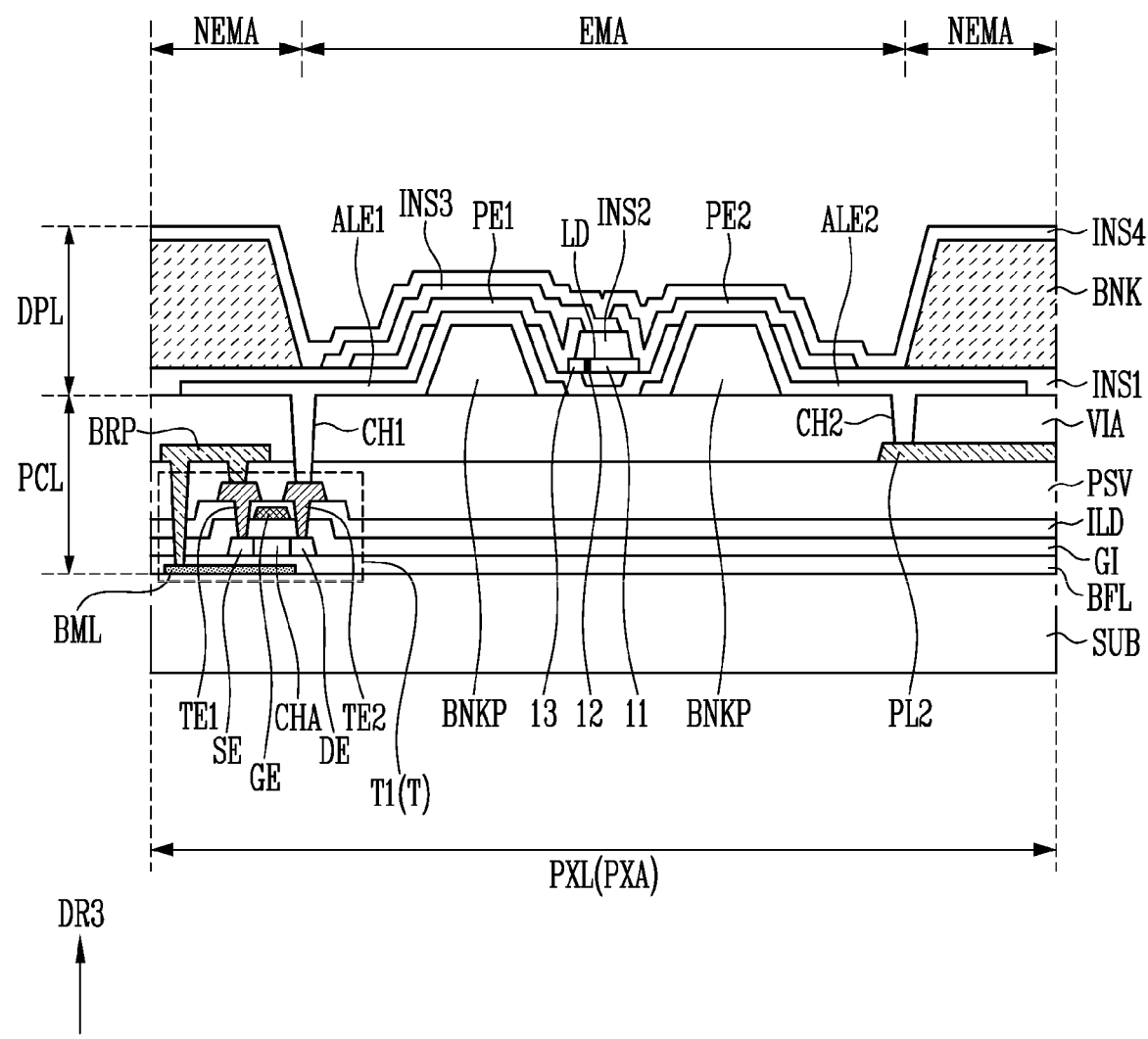
FIGS. 19 and 20 are sectional views schematically illustrating embodiments of the pixel shown in FIG. 17.
Figure 20:
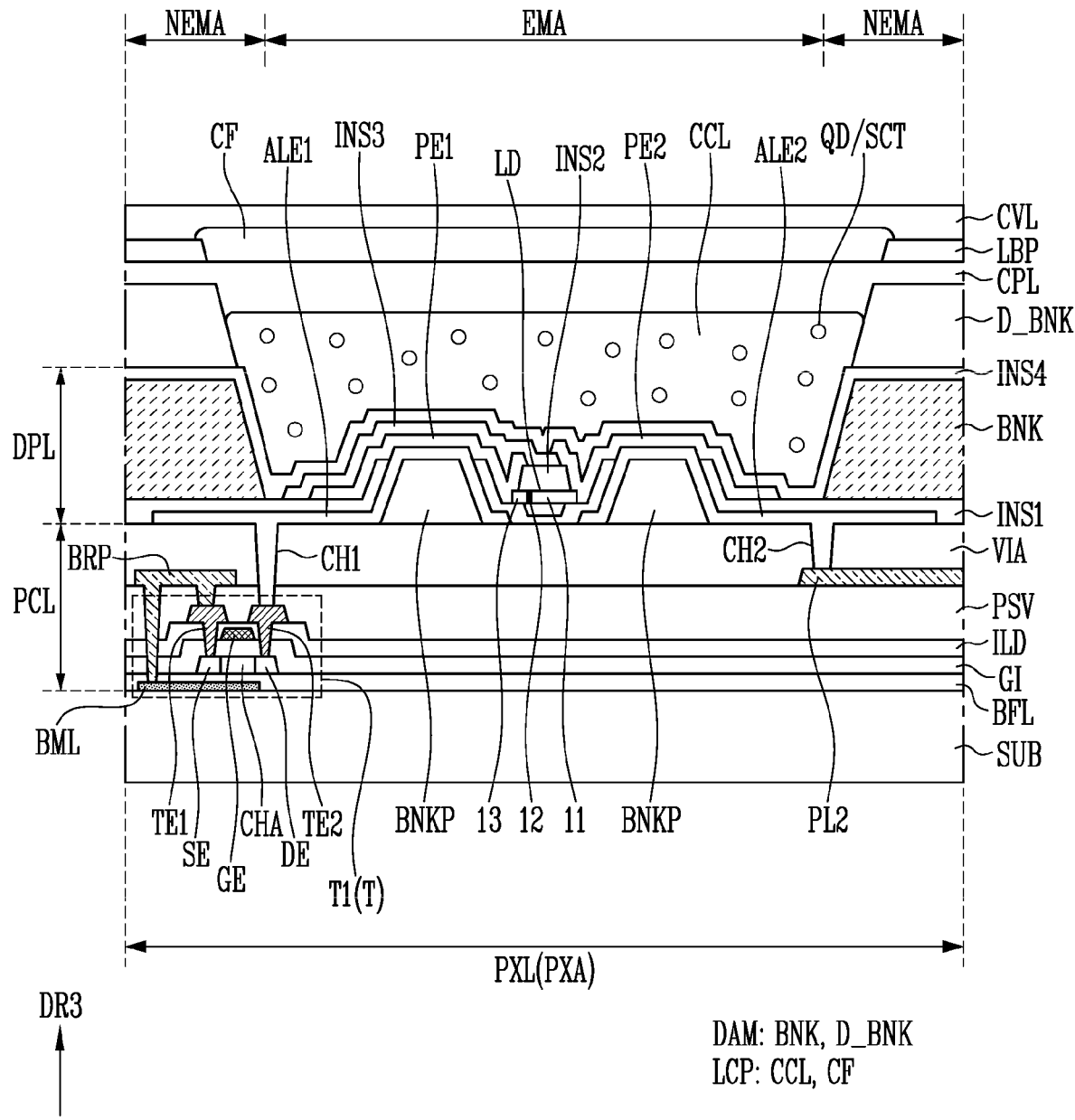

FIGS. 19 and 20 are sectional views schematically illustrating embodiments of the pixel shown in FIG. 17.

FIG. 20 illustrates a modified embodiment of an embodiment shown in FIG. 19.

In FIGS. 19 and 20, one pixel PXL is simplified and illustrated, such as that each electrode is illustrated as an electrode having a signal layer (or single film) and each insulating layer is illustrated as an insulating layer provided as a single layer (or single film), but the present disclosure is not limited thereto.

In FIGS. 19 and 20, a longitudinal direction (or vertical direction) on a section is represented as the third direction DR3.

For convenience, in FIGS. 19 and 20, the first transistor T1 corresponds to a driving transistor T from among the first to third transistors T1, T2, and T3, shown in FIG. 17, is illustrated as an example.

Referring to FIGS. 1 to 19, the pixel PXL may include the substrate SUB, a pixel circuit layer PCL, and a display element layer DPL. The pixel circuit layer PCL and the display element layer DPL may be disposed on one surface of the substrate SUB to overlap with each other.

The substrate SUB may include a transparent insulating material to enable light to be transmitted therethrough. The substrate SUB may be a rigid substrate or a flexible substrate.

Circuit elements (e.g., transistors T) of a pixel circuit PXC of a pixel PXL and signal lines (e.g., predetermined signal lines) connected to the circuit elements may be disposed in a pixel area PXA in which the corresponding pixel PXL is disposed. In addition, a light emitting element LD and first and second pixel electrodes PE1 and PE2, which constitute a light emitting unit EMU of the corresponding pixel PXL, may be disposed in the pixel area PXA. In an embodiment, the pixel area PXA may have an emission area EMA and a non-emission area NEMA.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, and a passivation layer (e.g., a via layer) PSV. The pixel circuit layer PCL may also include conductive layers disposed between the above-described insulating layers.

The buffer layer BFL may be entirely provided and/or formed on the substrate SUB. The buffer layer BFL may prevent an impurity from being diffused into a transistor T in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single layer but may also be provided as a multi-layer including at least two layers. When the buffer layer BFL is provided as the multi-layer, the layers may be formed of the same material or may be formed of different materials. In some embodiments, the buffer layer BFL may be omitted according to the material and process conditions of the substrate SUB.

The transistor T, a bridge pattern BRP, a lower line layer (e.g., an auxiliary line) BML, and a power line (e.g., a predetermined power line) may be disposed on the buffer layer BFL.

The transistor T may include the first transistor T1 for controlling a driving current of the light emitting element LD.

The first transistor T1 may include an active pattern (or semiconductor layer) and a gate electrode GE overlapping a portion of the active pattern. The active pattern may have a channel region CHA, a first contact region SE, and a second contact region DE.

The gate electrode GE may be provided and/or formed on the gate insulating layer GI. The gate electrode GE may be formed as a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof or may be formed as a double- or multi-layered structure including molybdenum (Mo), titanium (Ti), copper (Cu), aluminum (Al) or silver (Ag), which is a low-resistance material to decrease wiring resistance.

The gate insulating layer GI may be entirely provided and/or formed on the active pattern and the buffer layer BFL. The gate insulating layer GI may be an inorganic insulating layer including an inorganic material. In an embodiment, the gate insulating layer GI may include at least one of silicon nitride ($SiN_x$), silicon oxide ($SiO_x$), silicon oxynitride ($SiO_xN_y$), and metal oxide, such as aluminum oxide ($AlO_x$). However, the material of the gate insulating layer GI is not limited to the above-described embodiments. In some embodiments, the gate insulating layer GI may be an organic insulating layer including an organic material. The gate insulating layer GI may be provided as a single layer but may also be provided as a multi-layer including at least two layers.

The active pattern may be configured with poly-silicon, amorphous silicon, an oxide semiconductor, or the like. Each of the channel region CHA, the first contact region SE, and the second contact region DE may be formed as a semiconductor layer doped or undoped with an impurity. In an embodiment, each of the first contact region SE and the second contact region DE may be formed as a semiconductor layer doped with the impurity, and the channel region CHA may be formed as a semiconductor layer undoped with the impurity.

The channel region CHA of the first transistor T1 may be one region of the active pattern overlapping with the gate electrode GE of the corresponding transistor T. In an example, the channel region CHA of the first transistor T1 may be one region of the active pattern overlapping with the gate electrode GE of the first transistor T1.

The first contact region SE of the first transistor T1 may be connected to (or in contact with) one end of the channel region CHA. The first contact region SE of the first transistor T1 may be connected to a first connection member TE1.

The first connection member TE1 may be provided and/or formed on the interlayer insulating layer ILD. The first connection member TE1 may be electrically and/or physically connected to the first contact region SE of the first transistor T1 through a contact hole (e.g., a contact opening) penetrating the interlayer insulating layer ILD and the gate insulating layer GI. In an embodiment, the first connection member TE1 connected to the first contact region SE of the first transistor T1 may be electrically and/or physically connected to the bridge pattern BRP through a contact hole (e.g., a contact opening) penetrating the passivation layer PSV located on the interlayer insulating layer ILD.

The first connection member TE1 may include the same material as the gate electrode GE or may include at least one material selected from the materials exemplified as the material constituting the gate electrode GE.

The interlayer insulating layer ILD may be entirely provided and/or formed on the gate electrode GE and the gate insulating layer GI. The interlayer insulating layer ILD may include the same material as the gate insulating layer GI or include at least one material selected from the materials exemplified as the material constituting the gate insulating layer GI.

The bridge pattern BRP may be provided and/or formed on the passivation layer PSV. The bridge pattern BRP may be connected to the first contact region SE of the first transistor T1 through the first connection member TE1. Also, the bridge pattern BRP may be electrically and/or physically connected to the lower line layer BML through a contact hole (e.g., a contact opening) penetrating the passivation layer PSV, the interlayer insulating layer ILD, the gate insulating layer GI, and the buffer layer BFL. The lower line layer BML and the first contact region SE of the first transistor T1 may be electrically connected to each other through the bridge pattern BRP and the first connection member TE1.

The lower line layer BML may be a first conductive layer from among conductive layers provided on the substrate SUB. The lower line layer BML may be electrically connected to the first transistor T1 to widen the driving range of a voltage supplied to the gate electrode GE of the first transistor T1. In an embodiment, the lower line layer BML may be electrically connected to the first contact region SE of the first transistor T1 to stabilize the channel region of the first transistor T1. In addition, because the lower line layer BML is electrically connected to the first contact region SE of the first transistor T1, floating of the lower line layer BML can be prevented.

The second contact region DE of the first transistor T1 may be connected to (or in contact with) the other end of the channel region CHA of the corresponding transistor T. Also, the second contact region DE of the first transistor T1 may be connected to (or in contact with) a second connection member TE2.

The second connection member TE2 may be provided and/or formed on the interlayer insulating layer ILD. The second connection member TE2 may be electrically and/or physically connected to the second contact region DE of the first transistor T1 through a contact hole (e.g., a contact opening) penetrating the interlayer insulating layer ILD and the gate insulating layer GI.

In the above-described embodiment, the first transistor T1 is a thin film transistor having a top gate structure has been described as an example. However, the present disclosure is not limited thereto, and the structure of the first transistor T1 may be variously modified.

The power line may be (or may include), for example, a second power line PL2. The second power line PL2 may be provided and/or formed on the passivation layer PSV. The second power line PL2 may be provided on the same layer as the bridge pattern BRP. However, the present disclosure is not limited thereto, and the position of the second power line PL2 in the pixel circuit layer PCL may be variously changed. The voltage of the second driving power source VSS is described above with reference to FIG. 17. The second power line PL2 may include a conductive material (or substance). In an example, the second power line PL2 may be formed as a single layer (or single film) including one selected from the group consisting of copper (Cu), molybdenum (Mo), tungsten (W), aluminum neodymium (AlNd), titanium (Ti), aluminum (Al), silver (Ag), and any alloy thereof or a mixture thereof or may be formed as a double-layer (or double-film) structure or a multi-layer (or multi-film) structure including molybdenum (Mo), titanium (Ti), copper (Cu), aluminum (Al) or silver (Ag), which is a low-resistance material to decrease wiring resistance. In an embodiment, the second power line PL2 may be a double layer (or double film) structure in which titanium (Ti)/copper (Cu) are sequentially stacked.

The pixel circuit layer PCL may further include the first power line PL1 described with reference to FIG. 17. The voltage of the first driving power source VDD described with reference to FIG. 17 may be applied to the first power line PL1.

A via layer VIA may be provided and/or formed over the bridge pattern BRP and the second power line PL2.

The via layer VIA may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The via layer VIA may have a first contact hole (e.g., a first contact opening) CH1 corresponding to a contact hole (e.g., a contact opening) in the passivation layer PSV through which the second connection member TE2 electrically connected to the first transistor T1 extends (or is exposed). Also, the via layer VIA may include a second contact hole (e.g., a second contact opening) CH2 through which a portion of the second power line PL2 is exposed.

The display element layer DPL may be provided and/or formed on the via layer VIA (or the pixel circuit layer PCL).

The display element layer DPL may include a bank pattern BNKP, a bank BNK, first and second alignment electrodes ALE1 and ALE2, the first and second pixel electrodes PE1 and PE2, and first to fourth insulating layers INS1, INS2, INS3, and INS4.

The bank pattern BNKP may be provided and/or formed on the via layer VIA and may be located in the emission area EMA in which light is emitted in the pixel PXL. The bank pattern BNKP may support each of the first and second alignment electrodes ALE1 and ALE2 to change a surface profile (or shape) of each of the first and second alignment electrodes ALE1 and ALE2 such that light emitted from the light emitting element LD is guided in an image display direction of the display panel DP (or the display device DD). The bank pattern BNKP may be an inorganic insulating layer including an inorganic material or an organic insulating layer including an organic material. In some embodiments, the bank pattern BNKP may include a single-layer organic insulating layer and/or a single-layer inorganic insulating layer, but the present disclosure is not limited thereto. In some embodiments, the bank pattern BNKP may be provided in the form of a multi-layer in which at least one organic insulating layer and at least one inorganic insulating layer are stacked. However, the material of the bank pattern BNKP is not limited to the above-described embodiment. In some embodiments, the bank pattern BNKP may include a conductive material.

The bank BNK may surround (or cover) at least one side of a peripheral area (e.g., the non-emission area NEMA in which light is not emitted) of the pixel PXL. The bank BNK may be a pixel defining layer or a dam structure, which defines the emission area EMA to which the light emitting element LD is to be supplied in a process of supplying the light emitting element LD to the pixel PXL. In an embodiment, the emission area EMA of the pixel PXL is partitioned by the bank BNK so that a mixed ink including a desired amount and/or kind of light emitting element LD can be supplied (or input or deposited) to the emission area EMA. The bank BNK includes at least one light blocking material and/or at least one reflective material to prevent a light leakage defect in which light (e.g., a light beam) is leaked between the pixel PXL and pixels PXL adjacent thereto. In some embodiments, the bank BNK may include a transparent material (or substance). In an embodiment, the transparent material may include polyamide resin, polyimide resin, and the like, but the present disclosure is not limited thereto. In another embodiment, a reflective material layer may be separately provided and/or formed on the bank BNK to further improve the efficiency of light emitted from the pixel PXL.

Each of the first and second alignment electrodes ALE1 and ALE2 may be provided and/or formed over the bank pattern BNKP to have a surface profile corresponding to the shape of the bank pattern BNKP. Each of the first and second alignment electrodes ALE1 and ALE2 may be made of a material having a constant reflexibility to guide light emitted from the light emitting element LD in the image display direction of the display panel DP (or the display device DD). In an embodiment, each of the first alignment electrode ALE1 and the second alignment electrode ALE2 may be configured with a conductive material (or substance) having a constant reflexibility. The conductive material (or material) may include an opaque metal to reflect light emitted from the light emitting element LD in the image display direction of the display panel DP (or the display device DD). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the first alignment electrode ALE1 and the second alignment electrode ALE2 may include a transparent conductive material (or substance). When the each of the first alignment electrode ALE1 and the second alignment electrode ALE2 includes a transparent conductive material (or substance), a separate conductive layer made of an opaque metal for reflecting light emitted from the light emitting element LD in the image display direction of the display panel DP (or the display device DD) may be added. However, the material of the first alignment electrode ALE1 and the second alignment electrode ALE2 is not limited to the above-described materials.

The first alignment electrode ALE1 may be electrically connected to the first transistor T1 through the first contact hole CH1 penetrating the via layer VIA and the passivation layer PSV and the second connection member TE2, and the second alignment electrode ALE2 may be electrically connected to the second power line PL2 through the second contact hole CH2 penetrating the via layer VIA.

The light emitting element LD may be disposed between the first alignment electrode ALE1 and the second alignment electrode ALE2 and may be electrically connected to each of the first and second alignment electrodes ALE1 and ALE2. The light emitting element LD may emit any one of colored light and/or white light. The light emitting element LD is provided in a form in which the light emitting element LD is sprayed in a mixed ink to be input to the pixel PXL. The light emitting element LD may include a light emitting stack pattern in which a first semiconductor layer 11, an active layer 12, and a second semiconductor layer 13 are sequentially stacked along one direction. Also, the light emitting element LD may include an insulative film surrounding an outer circumferential surface of the light emitting stack pattern.

Light emitting elements LD may be mixed in a volatile solvent to be input (or supplied or deposited) to the pixel area PXA through an inkjet printing process or a slit coating process. When an alignment signal corresponding to each of the first alignment electrode ALE1 and the second alignment electrode ALE2 is provided, an electric field may be formed between the first alignment electrode ALE1 and the second alignment electrode ALE2. Therefore, the light emitting elements LD may be aligned between the first alignment electrode ALE1 and the second alignment electrode ALE2.

The light emitting element LD may be provided and/or formed on the first insulating layer INS1.

The first insulating layer INS1 may be provided and/or formed between each of the first alignment electrode ALE1 and the second alignment electrode ALE2 and the via layer VIA. The first insulating layer INS1 may fill a space between the light emitting light LD and the via layer VIA to stably support the light emitting element LD. The first insulating layer INS1 may include an inorganic insulating layer made of an inorganic material or an organic insulating layer made of an organic material. The first insulating layer INS1 may be partially opened to expose each of a portion of the first alignment electrode ALE1 and a portion of the second alignment electrode ALE2.

The second insulating layer INS2 may be provided and/or formed on the light emitting element LD. The second insulating layer INS2 may be provided and/or formed on the light emitting element LD to cover a portion of a top surface of the light emitting element LD and to expose both end portions of the light emitting element LD to the outside. The second insulating layer INS2 may further fix the light emitting element LD.

The first pixel electrode PE1 and the second pixel electrode PE2 may be disposed to be spaced apart from each other on the second insulating layer INS2 on the light emitting element LD.

The first pixel electrode PE1 may be formed on the first alignment electrode ALE1 and one end portion of the light emitting element LD to be electrically connected to the one end portion of the light emitting element LD. The first pixel electrode PE1 may be electrically and/or physically connected to the first alignment electrode ALE1 while being in direct contact with the first alignment electrode ALE1 exposed as a portion of the first insulating layer INS1 is removed. In an embodiment, the first pixel electrode PE1 may be an anode.

The second pixel electrode PE2 may be formed on the second alignment electrode ALE2 and the other end portion of the light emitting element LD to be electrically connected to the other end portion of the light emitting element LD. The second pixel electrode PE2 may be electrically and/or physically connected to the second alignment electrode ALE2 while being in contact with the second pixel electrode PE2 exposed as another portion of the first insulating layer INS1 is removed. In an embodiment, the second pixel electrode PE2 may be a cathode.

The first pixel electrode PE1 and the second pixel electrode PE2 may be configured with various transparent conductive materials such that light emitted from the light emitting element LD advances in the image display direction of the display device DD without any (e.g., without substantial) loss.

In an embodiment, the first pixel electrode PE1 and the second pixel electrode PE2 may be provided in different layers. The third insulating INS3 may be provided and/or formed between the first pixel electrode PE1 and the second pixel electrode PE2. The third insulating layer INS3 may be provided over the first pixel electrode PE1 to cover the first pixel electrode PE1 (or to allow the first pixel electrode PE1 not to be exposed to the outside), thereby preventing corrosion of the first pixel electrode PE1 or the like. The third insulating layer INS3 may include an inorganic insulating layer made of an inorganic material or an organic insulating layer made of an organic material.

The fourth insulating layer INS4 may be provided and/or formed over the first pixel electrode PE1 and the second pixel electrode PE2. The fourth insulating layer INS4 may be an inorganic layer (or inorganic insulating layer) including an inorganic material or an organic layer (or organic insulating layer) including an organic material. In an example, the fourth insulating layer INS4 may have a structure in which at least one inorganic layer and at least one organic layer are alternately stacked. The fourth insulating layer INS4 may entirely cover the display element layer DPL, thereby blocking external moisture, external humidity or the like from being introduced into the display element layer DPL including the light emitting elements LD.

In some embodiments, as shown in FIG. 20, a dummy bank D_BNK and the color conversion layer CCL may be provided and/or formed on the fourth insulating layer INS4.

The dummy bank D_BNK may be located on the fourth insulating layer INS4 over the bank BNK. The dummy bank D_BNK along with the bank BNK may implement a dam part (e.g., a dam structure) DAM. The dam part DAM may be a structure which defines the emission area EMA in which light is emitted in the pixel PXL. In an embodiment, the dam part DAM may be a structure which defines the emission area EMA to which the color conversion layer CCL is to be supplied. In an embodiment, the emission area EMA of the pixel PXL is partitioned by the dam part DAM so that a desired amount and/or a desired kind of color conversion layer CCL can be supplied (or input or formed) to the emission area EMA.

The dummy bank D_BNK may include a light blocking material. In an embodiment, the dummy bank D_BNK may be a black matrix. In some embodiments, the dummy bank D_BNK may be configured to include at least one light blocking material and/or at least one reflective material. Thus, the dummy bank D_BNK allows light emitted from the light emitting elements LD to further advance in the image display direction of the display device (or the third direction DR3), thereby improving light emission efficiency of the light emitting elements LD.

The color conversion layer CCL may be located on the fourth insulating layer INS4 over the first and second pixel electrodes PE1 and PE2. In an embodiment, the color conversion layer CCL may be located in the emission area EMA of the pixel area PXA.

The color conversion layer CCL may include color conversion particles QD corresponding to a specific color. In an embodiment, the color conversion layer CCL may include color conversion particles QD for converting light of a first color, which is emitted from light emitting elements LD, into light of a second color. When the pixel PXL is a red pixel (or red sub-pixel), the color conversion layer CCL may include color conversion particles QD of a red quantum dot, which convert light of a first color, which is emitted from the light emitting elements LD, into light of a second color (e.g., red light). When the pixel PXL is a green pixel (or green sub-pixel), the color conversion layer CCL may include color conversion particles QD of a green quantum dot, which convert light of a first color, which is emitted from the light emitting elements LD, into light of a second color (e.g., green light). When the pixel PXL is a blue pixel (or blue sub-pixel), the color conversion layer CCL may include color conversion particles QD of a blue quantum dot, which convert light of a first color, which is emitted from the light emitting elements LD, into light of a second color (e.g., blue light). In some embodiments, when the pixel PXL is the blue pixel (or blue sub-pixel), a light scattering layer including light scattering particles may be provided instead of the color conversion layer CCL including the color conversion particles QD. In an embodiment, when the light emitting elements LD emit blue light, the pixel PXL may include a light scattering layer including light scattering particles SCT instead of the color conversion layer CCL including the color conversion particles QD. The above-described light scattering layer may be omitted in some embodiments. In other embodiments, when the pixel PXL is the blue pixel (or blue sub-pixel), a transparent polymer may be provided instead of the color conversion layer CCL.

A capping layer CPL may be provided and/or formed over the color conversion layer CCL and the dummy bank D_BNK.

The capping layer CPL may be entirely (or wholly) in the pixel area PXA and may be directly disposed over the dummy bank D_BNK and the color conversion layer CCL. The capping layer CPL may be an inorganic layer (or organic insulating layer) including an inorganic material. The capping layer CPL may include at least one of silicon nitride ($SiN_x$), silicon oxide ($SiO_x$), silicon oxynitride ($SiO_xN_y$), and metal oxide such as aluminum oxide ($AlO_x$). The capping layer CPL covers the color conversion layer CCL while being located over the color conversion layer CCL to protect the color conversion layer CCL.

In some embodiments, the capping layer CPL may have a flat surface and may reduce a step difference occurring due to components disposed thereunder. In an embodiment, the capping layer CPL may include an organic layer including an organic material. The capping layer CPL may be a common layer commonly provided in the display area including the pixel area PXA, but the present disclosure is not limited thereto.

The color filter CF and a light blocking pattern LBP may be provided and/or formed on the capping layer CPL.

The color filter CF may allow light of a specific color to be selectively transmitted therethrough. The color filter CF, along with the color conversion layer CCL, may constitute a light conversion pattern LCP and may include a color filter material that allows light of a specific color converted in the color conversion layer CCL to be selectively transmitted therethrough. The color filter CF may include a red color filter, a green color filter, and a blue color filter. The above-described color filter CF may be provided on one surface of the capping layer CPL to correspond to the color conversion layer CCL.

The light conversion pattern LCP including the color conversion layer CCL and the color filter CF may correspond to the emission area EMA of the pixel PXL.

The light blocking pattern LBP may be disposed on the one surface of the capping layer CPL to be adjacent to the color filter CF. In an embodiment, the light blocking pattern LBP may be located on the one surface of the capping layer CPL to correspond to the non-emission area NEMA of the pixel area PXA. The light blocking pattern LBP may correspond to the dam part DAM. The light blocking pattern LBP may include a light blocking material, which prevents a light leakage defect in which light (e.g., a light beam) is leaked between the pixel PXL and pixels adjacent thereto. In an embodiment, the light blocking pattern LBP may include a black matrix. The light blocking pattern LBP may prevent color mixture of lights respectively emitted from adjacent pixels PXL.

The light blocking pattern LBP may be provided in the form of a multi-layer (or multi-film) in which at least two color filters, which allow light of different colors to be selectively transmitted therethrough, overlap with each other. In an example, the light blocking pattern LBP may be provided in a form including a red color filter, a green color filter overlapping with the red color filter while being located on the red color filter, and a blue color filter overlapping with the green color filter while being located on the green color filter. For example, the light blocking pattern LBP may be provided in the form of a structure in which a red color filter, a green color filter, and a blue color filter are sequentially stacked. The red color filter, the green color filter, and the blue color filter in the non-emission area NEMA of the pixel area PXA may be used as the light blocking pattern LBP, which blocks transmission of light.

A cover layer CVL may be provided and/or formed over the light blocking pattern LBP and the color filter CF.

In the display device DD according to the above-described embodiment, the light conversion pattern LCP is disposed over the light emitting element LD so that light having excellent color reproducibility is emitted through the light conversion pattern LCP, thereby improving light emission efficiency.

According to the present disclosure, the display device includes a holding member that holds a rotating member (e.g., a rotating member which rolls or unroll a display panel), and the holding member varies a position of the rotating member inside a housing. The display panel moves the rotating member to become close to a slot of the housing in a state in which the display panel is completely unrolled so that a non-driving area of the display panel (e.g., an area which is not exposed to the outside of the housing) can be reduced.

Example embodiments have been disclosed herein, and although specific terms are employed, they are used and are to be interpreted in a generic and descriptive sense and not for purpose of limitation. In some instances, as would be apparent to one of ordinary skill in the art, features, characteristics, and/or elements described in connection with a one embodiment may be used singly or in combination with features, characteristics, and/or elements described in connection with other embodiments unless specifically indicated otherwise. Accordingly, it will be understood by those of skill in the art that various changes in form and details may be made without departing from the spirit and scope of the present disclosure as set forth in the following claims and their equivalents.

What is claimed is:

1. A display device comprising:
   a display panel comprising pixels;
   a housing accommodating the display panel, the housing having a slot at one side surface thereof;
   a rotating member inside the housing, the rotating member configured for rolling and unrolling the display panel; and
   a holding member fixed to an inner side of the housing and holding the rotating member, the holding member being configured to vary a position of the rotating member inside the housing.

2. The display device of claim 1, wherein the holding member is configured to move the rotating member away from the slot when the display panel is rolled and to move the rotating member toward the slot when the display panel is unrolled.

3. The display device of claim 1, wherein the holding member is configured to move the rotating member in a first direction in which the display panel is unrolled.

4. The display device of claim 3, wherein the holding member comprises:
   a first fixing part coupled to the housing; and
   a first moving part movably coupled to the first fixing part, the first moving part holding the rotating member.

5. The display device of claim 4, wherein the first moving part comprises a first rack extending in the first direction, and
   wherein the first fixing part comprises a first pinion gear engaged with the first rack.

6. The display device of claim 5, wherein the holding member further comprises a first driving part rotating the first pinion gear.

7. The display device of claim 4, wherein the first moving part comprises:
   a first belt having an end coupled to the first fixing part; and
   a wheel coupled to another end of the first belt, the wheel configured for rolling and unrolling the first belt.

8. The display device of claim 3, wherein the holding member is configured to move the rotating member in each of the first direction and a second direction perpendicular to the first direction.

9. The display device of claim 1, wherein the holding member is configured to move the rotating member in a second direction perpendicular to a first direction in which the display panel is unrolled.

10. The display device of claim 9, wherein the holding member comprises:
    a second fixing part fixed to the housing; and
    a second moving part movably coupled to the second fixing part, the second moving part supporting the rotating member.

11. The display device of claim 10, wherein the second moving part comprises a second rack extending in the second direction, and wherein the second fixing part comprises a second pinion gear engaged with the second rack.

12. The display device of claim 11, wherein the holding member further comprises a second driving part rotating the second pinion gear.

13. The display device of claim 10, wherein the second fixing part comprises:
   a first gear;
   a second gear spaced apart from the first gear; and
   a second belt coupled to the first and second gears, and wherein the second moving part is coupled to a portion of the second belt.

14. The display device of claim 1, wherein the holding member is configured to move the rotating member in a third direction toward the slot from a rotating shaft of the rotating member.

15. The display device of claim 14, wherein the holding member comprises:
   a fixing part fixed to the housing; and
   a moving part movably coupled to the fixing part, the moving part holding the rotating member.

16. The display device of claim 15, wherein the moving part comprises a rack extending in the third direction, and wherein the fixing part comprises a pinion gear engaged with the rack.

17. The display device of claim 16, wherein the holding member further comprises a driving part configured to rotate the pinion gear.

18. The display device of claim 1, wherein the holding member is configured to move the rotating member toward the slot after the display panel is completely unrolled.

19. The display device of claim 18, wherein the rotating member is configured to roll the display panel, after the holding member moves the rotating member, away from the slot.

20. The display device of claim 1, wherein the holding member is configured to vary the position of the rotating member while the rotating member rolls and unrolls the display panel.

21. A method of driving a display device, the display device comprising a rotating member configured for rolling and unrolling a display panel inside a housing having a slot at one side surface thereof; and a holding member fixed to an inner side of the housing and holding the rotating member, the method comprising:
   unrolling the display panel via the rotating member;
   moving the rotating member toward the slot via the holding member;
   rolling the display panel via the rotating member; and
   moving the rotating member away from the slot via the holding member.

22. The method of claim 21, wherein the moving of the rotating member toward the slot comprises moving the rotating member toward the slot after the display panel is completely unrolled.

23. The method of claim 22, wherein, during the rolling of the display panel, the display panel is rolled after the rotating member is moved away from the slot.

24. The method of claim 21, wherein, during each of the moving of the rotating member toward the slot and the moving of the rotating member away from the slot, a position of the rotating member is varied while the rotating member rolls and unrolls the display panel.

* * * * *